(12) United States Patent
Suga et al.

(10) Patent No.: US 9,263,786 B2
(45) Date of Patent: Feb. 16, 2016

(54) COUPLER, ELECTRONIC COMPONENT, AND MANUFACTURING METHOD FOR ELECTRONIC COMPONENT

(71) Applicant: TDK Corporation, Tokyo (JP)

(72) Inventors: Takeshi Suga, Tokyo (JP); Toshiyasu Fujiwara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 39 days.

(21) Appl. No.: 14/372,013

(22) PCT Filed: Feb. 22, 2013

(86) PCT No.: PCT/JP2013/054513
§ 371 (c)(1),
(2) Date: Jul. 12, 2014

(87) PCT Pub. No.: WO2013/129251
PCT Pub. Date: Sep. 6, 2013

(65) Prior Publication Data
US 2014/0375395 A1    Dec. 25, 2014

(30) Foreign Application Priority Data
Feb. 27, 2012    (JP) .................. 2012-039586

(51) Int. Cl.
*H01P 5/18* (2006.01)
*H01P 11/00* (2006.01)
(Continued)

(52) U.S. Cl.
CPC *H01P 5/18* (2013.01); *H01P 5/185* (2013.01); *H01P 11/003* (2013.01); *H03G 1/0005* (2013.01); *H03G 3/3036* (2013.01)

(58) Field of Classification Search
CPC .............. H01P 5/18; H01P 5/185; H01P 1/22
USPC .................. 333/109, 112, 116, 117
See application file for complete search history.

(56) References Cited

U.S. PATENT DOCUMENTS 6,342,681 B1 *   1/2002   Goldberger ............. H01P 5/185
                                                    174/250
6,529,099 B1 *   3/2003   Takenaka .................. H01P 5/10
                                                    333/156

(Continued)

FOREIGN PATENT DOCUMENTS

JP    H01-158763 A    6/1989
JP    H01-179353 A    7/1989

(Continued)

OTHER PUBLICATIONS

Translation of International Preliminary Report on Patentability of Sep. 12, 2014 and translation of Written Opinion of the International Searching Authority of May 14, 2013 in related application PCT/JP2013/054513.

*Primary Examiner* — Dean Takaoka
(74) *Attorney, Agent, or Firm* — Young Law Firm, P.C.

(57) ABSTRACT

A coupler includes an input terminal and an output terminal which are provided on a substrate, a main line provided on the substrate and having one end connected to the input terminal and the other end connected to the output terminal, and a sub line including a conductive film and a resistive film which are provided on the substrate and electromagnetically coupled to the main line at a part of the conductive film. The conductive film has wiring patterns. The resistive film includes a resistive film pattern having an end portion fitted into between the wiring pattern and substrate and an end portion fitted into between the wiring pattern and substrate. The end portions and each contact the conductive film at least at its upper surface and end surface.

10 Claims, 21 Drawing Sheets

(51) Int. Cl.
*H03G 1/00* (2006.01)
*H03G 3/30* (2006.01)
*H01P 1/22* (2006.01)

(56) References Cited

U.S. PATENT DOCUMENTS

| | | | |
|---|---|---|---|
| 7,961,064 B2* | 6/2011 | Kearns | H01P 5/184 |
| | | | 333/109 |
| 8,421,553 B2* | 4/2013 | Mukaiyama | H01P 5/187 |
| | | | 333/109 |
| 8,525,614 B2* | 9/2013 | Fujiwara | H01P 5/16 |
| | | | 333/109 |

FOREIGN PATENT DOCUMENTS

| | | |
|---|---|---|
| JP | 2004-014834 A | 1/2004 |
| JP | 2009-044303 A | 2/2009 |
| JP | 2010-003934 A | 1/2010 |
| JP | 2010-147089 | 7/2010 |
| JP | 2011-114828 | 6/2011 |
| JP | 2011-114829 | 6/2011 |
| JP | 2012-023661 A | 2/2012 |

* cited by examiner

COUPLER, ELECTRONIC COMPONENT, AND MANUFACTURING METHOD FOR ELECTRONIC COMPONENT

TECHNICAL FIELD

The present invention relates to a coupler, an electronic component, and a manufacturing method for the electronic component and, more particularly, to a coupler and an electronic component incorporating, as an attenuator, a resistor element manufactured through a thin-film process favorable to reduction in size and thickness and a manufacturing method for the electronic component.

BACKGROUND ART

A wireless communication device includes various high-frequency elements such as an antenna, a filter, an RF switch, a power amplifier, a coupler, and a balun. Of these elements, the coupler, which is also called "Directional Coupler", is used for picking up a part of an output of a power amplifier and feeding it back to an input of the power amplifier. The feedback using the coupler allows an output gain of the power amplifier to be maintained constant.

As the wireless communication device using the coupler, there can be exemplified a mobile communication device such as a mobile phone or a mobile terminal, a wireless LAN device, and the like. Because of remarkable progress in size reduction of these wireless communication devices, the coupler is required to achieve further reduction in size and thickness. An example of the coupler used in these devices is disclosed in Patent Documents 1 and 2.

Recently, in addition to the use in the power amplifier, the coupler comes to be used for the purpose of controlling an antenna tuner. In this case, the coupler plays a role of reducing sensing error or wiring loss in a transmission/reception section of the wireless communication device.

In a case where the coupler is used for the purpose of controlling the antenna tuner, sometimes the coupler is required to incorporate a resistor element serving as an attenuator so as to achieve connection to an element having a different impedance therefrom and to respond to an impedance disturbance. Patent Document 3 discloses an example of the resistor element of such a type (although it is an example of a terminating resistor element, instead of the coupler).

CITATION LIST

Patent Document

[Patent Document 1] Japanese Patent Application Laid-Open No. 2011-114828
[Patent Document 2] Japanese Patent Application Laid-open No. 2011-114829.
[Patent Document 3] Japanese Patent Application Laid-Open No. 2010-147089

SUMMARY OF THE INVENTION

Problems to be Solved by the Invention

In a case where the resistor element serving as the attenuator is incorporated in the coupler, a bridge portion formed by a resistive film is provided in the middle of a sub line electromagnetically coupled to a main line through which a communication signal flows. Conventionally, the coupler of such a type is manufactured as follows: a resistive film and a conductive film are sequentially formed on the entire surface of a substrate; these films are sequentially patterned into a shape of the sub line; and the conductive film only at the bridge portion formed by the resistive film is removed. In a paragraph [0023] of Patent Document 3, an example of such a manufacturing method is disclosed (although it is an example of the manufacturing method for a terminating resistor element, instead of the coupler).

Referring to FIGS. 1 and 2 of Patent Document 3, it seems that a part of an input electrode 20 (conductive film) that is not formed on an upper surface of a connection part 40C (a part of a resistive film pattern 40 (resistive film)) is up in the air and that the resistive film pattern 40 does not exist below that portion. However, considering that a terminating resistor element 1 illustrated in FIGS. 1 and 2 is manufactured according to the manufacturing method described in the paragraph [0023], it is reasonable to consider that the resistive film pattern 40 is formed on the entire lower surface of the input electrode 20.

However, in the above manufacturing method, the resistive film remains just below the conductive film. When a current signal flows in the sub line in this state, considerable portion of the current signal flows in the resistive film (not the conductive film) also at a portion other than the bridge portion. A current signal is attenuated more significantly in the resistive film than in the conductive film, so that the current signal does not flow in the conductive film but in the resistive film means an attenuation amount of the current signal becomes large.

The flowing of the current signal in the resistive film is caused by so-called a skin effect. The skin effect has frequency characteristics, so that the attenuation amount differs depending on a frequency of the current signal. A broadband signal is used in recent mobile communication devices or wireless LAN devices, so that occurrence of a frequency-dependent difference in the attenuation amount makes circuit design difficult. Therefore, it is required to reduce influence of the skin effect as much as possible to reduce the frequency-dependent difference in the attenuation amount.

The reducing of the influence of the skin effect itself can be realized by employing a configuration in which the resistive film does not remain just below the conductive film. Patent Document 3 discloses in FIG. 5 thereof an example of the configuration in which the resistive film does not remain just below the conductive film (although it is an example of the terminating resistor element, instead of the coupler).

However, in the example as disclosed in FIG. 5 of Patent Document 3 that simply prevents the resistive film from remaining just below the conductive film, the conductive film and resistive film contact each other only at their vertical surfaces, which poses another problem that contact resistance between the conductive film and resistive film becomes significantly large. Thus, it is required to reduce the frequency-dependent difference in the attenuation amount while reducing the contact resistance between the conductive film and resistive film.

The above problems are not limited to the coupler, but are universal to an electronic component provided with a wiring formed of a conductive film including a plurality of wiring patterns and a resistive film serving as an attenuator disposed between the wiring patterns.

Means for Solving the Problems

An object of the present invention is therefore to provide a coupler, an electronic component, and a manufacturing method for the electronic component capable of reducing the frequency-dependent difference in the attenuation amount while reducing the contact resistance between the conductive film and resistive film.

A coupler according to the present invention to achieve the above object includes a substrate, an input terminal and an output terminal which are provided on the substrate, a main line provided on the substrate and having one end connected to the input terminal and the other end connected to the output terminal, and a sub line including a conductive film and a resistive film which are provided on the substrate and electromagnetically coupled to the main line at a part of the conductive film. The conductive film has first and second wiring patterns. The resistive film includes a first resistive film pattern having a first end portion fitted into between the first wiring pattern and substrate and a second end portion fitted into between the second wiring pattern and substrate. The first and second end portions each contact the conductive film at least at its upper surface and end surface.

According to the present invention, the end surfaces of the first and second end portions contact the conductive film. It follows that at least a part of a lower surface of the conductive film is not covered by the resistive film. Thus, it is possible to reduce a frequency-dependent difference in an attenuation amount as compared to a conventional example having a structure in which the entire lower surface of the conductive film is covered by the resistive film. Further, the first and second end portions each contact the conductive film at least at its upper surface and end surface, so that it is possible to reduce contact resistance between the conductive film and resistive film as compared to a conventional example having a structure in which the first and second end portions each contact the conductive film only at its end surface.

The coupler further includes an insulating film formed so as to cover the resistive film. The insulating film has first and second through holes in which the first and second end portions are exposed, respectively, and the resistive film and conductive film contact each other inside the first and second through holes. With this configuration, the resistive film is covered by the insulating film at a portion other than the first and second through holes, thereby preventing the resistive film from being oxidized during a manufacturing process of the coupler. As a result, a location-dependent variation in a resistance value of the resistive film in a substrate surface can be reduced.

In the coupler, a film thickness of the first resistive film pattern is gradually reduced from a part thereof contacting an inner wall of each of the first and second through holes to a corresponding end surface thereof. With this configuration, the contact resistance between the conductive film and resistive film can be reduced further.

Further, in the coupler, the first resistive film pattern is a linear pattern extending in a first direction, and a width of the first resistive film in a second direction perpendicular to the first direction is smaller than a width of each of the first and second through holes in the second direction. With this configuration, even if a formation position of each of the first and second through holes is slightly displaced, the first and second end portions can be adequately exposed in the first and second though holes, respectively.

An electronic component according to the present invention includes a substrate and a wiring including a conductive film and resistive film which are provided on the substrate. The conductive film has first and second wiring patterns. The resistive film includes a first resistive film pattern having a first end portion fitted into between the first wiring pattern and substrate and a second end portion fitted into between the second wiring pattern and substrate. The first and second end portions each contact the conductive film at least at its upper surface and end surface.

An electronic component manufacturing method according to the present invention includes: forming a resistive film having a first resistive film pattern including first and second end portions; forming, after formation of the resistive film, an insulating film covering an upper surface of the first resistive film pattern excluding upper surfaces of the first and second end portions and exposing the first and second end portions; forming, after formation of the insulating film, a conductive film having first and second wiring patterns covering the first and second end portions, respectively; forming a protective film having, at its bottom surface, a contact hole in which the conductive film is exposed; and forming a terminal contacting the conductive film through the contact hole.

According to the present invention, it is possible to manufacture an electronic component in which at least a part of a lower surface of the conductive film is not covered by the resistive film, and the resistive film contact the conductive film at least at an upper surface and an end surface of each of the first and second end portions. Further, the resistive film is covered by the insulating film before formation of the conductive film, so that it is possible to prevent the resistive film from being oxidized during the manufacturing process. Thus, a location-dependent variation in a resistance value of the resistive film in a substrate surface can be prevented.

Further, in the electronic component manufacturing method, the forming of the insulating film includes: forming a second resist pattern covering the first and second end portions; film-forming an insulating film material covering the second resist pattern; and removing the second resist pattern and insulating film material formed on an upper surface of the second resist pattern. With this configuration, it is possible to form, in the insulating film, first and second through holes in which the first and second end portions are exposed, respectively.

The electronic component manufacturing method further includes removing, after formation of the insulating film, a part of each of the exposed first and second end portions by reverse sputtering. With this configuration, the first resistive film pattern can be formed such that a film thickness thereof is gradually reduced from a part thereof contacting an inner wall of each of the first and second through holes to a corresponding end surface thereof.

Further, in the electronic component manufacturing method, the forming of the resistive film includes: film-forming a resistive film material; forming a first resist pattern covering the resistive film material; etching the resistive film material with the first resist pattern used as a mask; and removing the first resist pattern.

Further, in the electronic component manufacturing method, the forming of the conductive film includes: forming a seed electrode film; forming third resist patterns each covering the seed electrode film; film-forming a conductive film material between the resist patterns by plating; removing the third resist pattern; and removing a part of the seed electrode film that is not covered by the conductive film material.

The present invention can be configured to have the following first to fifth features.

That is, the present invention according to a first feature is a coupler including a substrate, a main line connected to an input terminal and an output terminal which are provided on the substrate, and a sub line including a wiring layer disposed on the substrate so as to be electromagnetically coupled to the main line and a thin-film resistive pattern. A width of the thin-film resistive pattern is smaller than a width of the wiring layer. Side end portions and an upper surface of the thin-film resistive pattern are covered by the wiring layer. A part of the upper surface of the thin-film resistive pattern other than a connection portion thereof to the wiring layer is covered by an insulating film.

According to the coupler of the first feature, the thin-film resistive pattern does not cover the entire lower surfaces of the main line and sub line and contacts the wiring layer only at a part of the lower surface of the sub line, so that it is possible to obtain a reduction effect of high-frequency loss caused due to a skin effect, which occurs in a high-frequency region. Thus, in frequency characteristics of an attenuator of a resistor-equipped coupler reduced in size and thickness, a variation in an attenuation amount in a high-frequency region can be reduced. Further, a part of the upper surface of the thin-film resistive pattern other than the connection portion to the wiring layer is covered by the first insulating film, so that it is possible to obtain an effect of preventing degradation of the thin-film resistive pattern due to oxidization and a heat radiation effect. Further, ESD resistance is enhanced, thereby preventing progress of degradation of the thin-film resistive pattern due to an input of static electricity.

The present invention according to a second feature is the coupler of the first feature, wherein the first insulating film is formed so as to cover an upper surface and side surfaces of the thin-film resistive pattern excluding a connection portion thereof to the wiring layer.

According to the coupler of the second feature, degradation of the thin-film resistive pattern due to influence of oxidization or the like can be further prevented as compared to a structure in which the first insulating film covers only the upper surface of the thin-film resistive pattern. Thus, a variation in a resistance value of the thin-film resistive pattern can be reduced.

The present invention according to a third feature is the coupler of the second feature, wherein the first insulating film has a through hole in an area corresponding to the connection portion between the thin-film resistive pattern and wiring layer, and an opening width of the through hole is larger than a width W of the thin-film resistive pattern.

According to the coupler of the third feature, the opening width of the through hole is larger than the width W of the thin-film resistive pattern, so that the entire end portion of the thin-film resistive pattern can be reliably exposed in the through hole. Thus, a variation in a resistance value of the thin-film resistive pattern can be reduced.

The first insulating film is preferably formed so as to cover the entire lower surfaces of the main line and sub line excluding a portion at which the through hole is formed. With this configuration, a contact area between the first insulating film and another insulating film (a planarizing film covering the substrate surface or an insulating film formed on the planarizing film) formed under the thin-film resistive pattern is increased to enhance adhesion between them, thereby suppressing peeling of the first insulating film.

The present invention according to a fourth feature is the coupler of the second feature or third feature, further including a second insulating film formed on the surface of the substrate, wherein the first and second insulating films are formed of the same material as that used for the substrate.

According to the coupler of the fourth feature, adhesion between the first and second insulating films can further be enhanced. Forming the first and second insulating films using an inorganic material, such as alumina or silicon nitride, having low responsiveness to the thin-film resistive pattern prevents degradation of the thin-film resistive pattern due to oxidization or the like to reduce a variation in a resistance value in the substrate surface.

The present invention according to a fifth feature is an electronic component includes a substrate and a wiring layer formed on the substrate. At least one thin-film resistive pattern is connected to the wiring layer. A width of the thin-film resistive pattern is smaller than a width of the wiring layer. Side end portions and an upper surface of the thin-film resistive pattern are covered by the wiring layer to be connected thereto. A part of the upper surface of the thin-film resistive pattern other than a connection portion thereof to the wiring layer is covered by an insulating film.

According to the electronic component of the fifth feature, the thin-film resistive pattern does not cover the entire lower surfaces of the main line and sub line and contacts the wiring layer only at a part of the lower surface of the sub line, so that it is possible to obtain a reduction effect of high-frequency loss caused due to a skin effect occurring in a high-frequency region. Thus, a variation in an attenuation amount in a high-frequency region of frequency characteristics can be reduced. Further, a part of the upper surface of the thin-film resistive pattern other than the connection portion to the wiring layer is covered by the insulating film, so that it is possible to obtain an effect of preventing degradation of the thin-film resistive pattern due to oxidization and a heat radiation effect. Further, ESD resistance is enhanced, thereby preventing progress of degradation of the thin-film resistive pattern due to an input of static electricity.

Advantages of the Invention

According to the present invention, a frequency-dependent difference in the attenuation amount can be reduced as compared to a conventional example in which the entire lower surface of the conductive film is covered by the resistive film. Further, the resistive film contact the conductive film at least at the upper surface and end surface of each of the first and second end portions, so that contact resistance between the conductive film and resistive film can be reduced as compared to a conventional example in which the resistive film contacts the conductive film only at its end surface of each of the first and second end portions.

Further, according to the present invention, it is possible to manufacture an electronic component in which at least a part of a lower surface of the conductive film is not covered by the resistive film, and the resistive film contact the conductive film at least at an upper surface and an end surface of each of the first and second end portions. Further, the resistive film is covered by the insulating film before formation of the conductive film, so that it is possible to prevent the resistive film from being oxidized during the manufacturing process. Thus, a location-dependent variation in a resistance value of the resistive film in a substrate surface can be prevented.

Further, in frequency characteristics of an attenuator of a resistor-equipped coupler reduced in size and thickness, a variation in an attenuation amount in a high-frequency region is reduced, and a variation in a resistance value of the resistive film at a time of formation thereof is reduced, whereby a variation in high-frequency characteristics of the attenuator can be reduced. Further, a variation in an attenuation amount in a high-frequency region of frequency characteristics of the electronic component having the structure according to the present invention can be reduced.

DETAILED DESCRIPTION OF THE EMBODIMENTS

Figure 1:
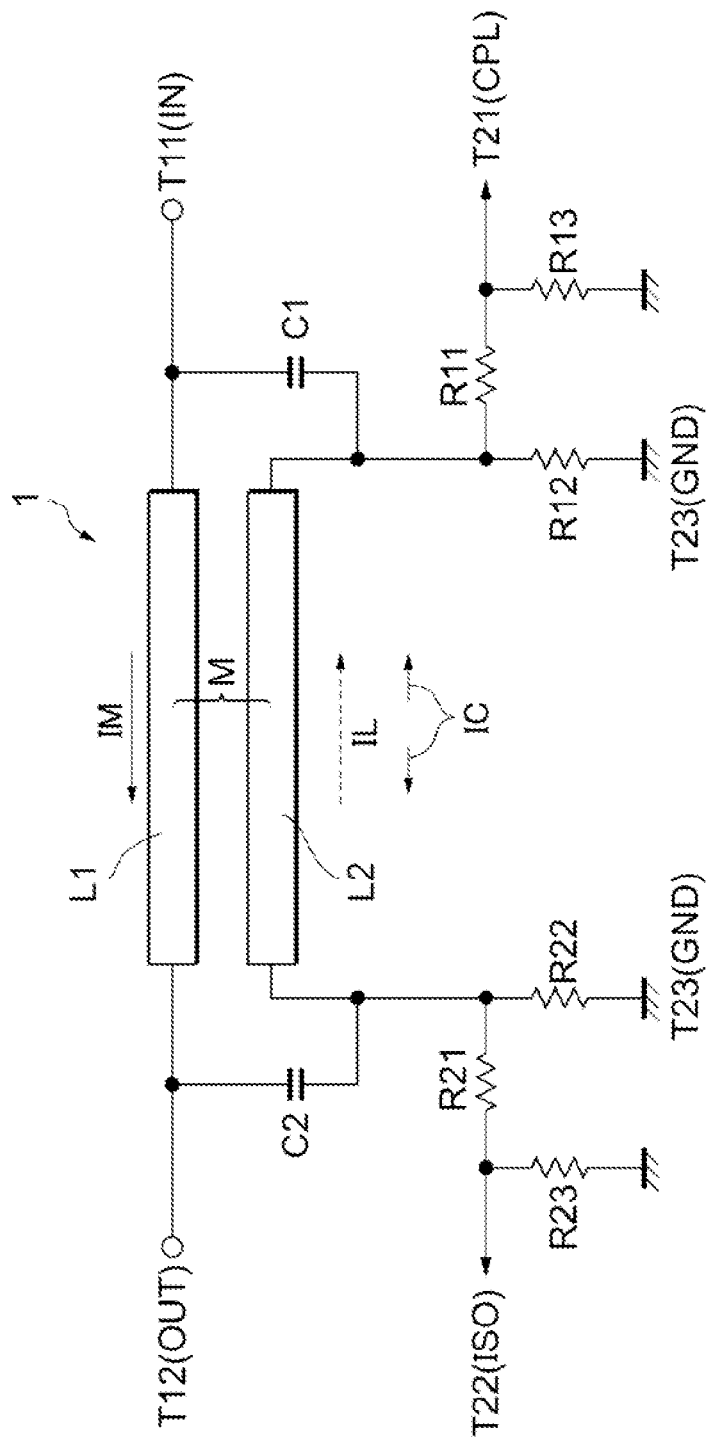
FIG. 1 is an equivalent circuit diagram illustrating a configuration of a coupler according to a preferred embodiment of the present invention.

Preferred embodiments of the present invention will be described below with reference to the drawings. Throughout the drawings, the same reference numerals are used to designate the same or similar components, and redundant descriptions thereof are omitted. Positional relationships such as upper, lower, left, and right will be based on positional relationships represented in the drawings unless otherwise specified. Further, ratios of dimensions in the drawings are not limited to those depicted. Further, the embodiments described hereinafter are illustrative and do not limit the present invention to the embodiments. Further, various modifications can be made without departing from the spirit of the present invention.

FIG. 1 is an equivalent circuit diagram illustrating a configuration of a coupler 1 according to embodiments of the present invention. As illustrated, the coupler 1 includes an input terminal T11, an output terminal T12, a coupling terminal T21, an isolation terminal T22, a first line L1, a second line L2, and thin-film resistive patterns (resistive film patterns) R11 to R13 and R21 to R23.

The first line L1 and second line L2 are disposed so as to be electromagnetically coupled to each other. FIG. 1 illustrates a magnetic coupling M and capacitive couplings C1 and C2 as examples of the electromagnetic coupling.

One end of the first line L1 is connected to the input terminal T11, and the other end thereof is connected to the output terminal T12. One end of the second line L2 is connected to the coupling terminal T21 through the thin-film resistive pattern R11, and the other end thereof is connected to the isolation terminal T22 through thin-film resistive pattern R21. One end of the thin-film resistive pattern R12 is connected between the second line L2 and thin-film resistive pattern R11, and the other end thereof is connected to a ground terminal 23. One end of the thin-film resistive pattern R13 is connected between the thin-film resistive pattern R11 and coupling terminal T21, and the other end thereof is connected to the ground terminal T23. One end of the thin-film resistive pattern R22 is connected between the second line L2 and thin-film resistive pattern R21, and the other end thereof is connected to the ground terminal T23. One end of the thin-film resistive pattern R23 is connected between the thin-film resistive pattern R21 and isolation terminal T22, and the other end thereof is connected to the ground terminal T23. The thin-film resistive patterns R11, R12, and R13 constitute a π-type attenuator connected to the coupling terminal T21. The thin-film resistive patterns R21, R22, and R23 constitute a π-type attenuator connected to the isolation terminal T22. Hereinafter, sometimes a line provided between the input terminal T11 and output terminal T12 is referred to as "main line", and a line provided between the coupling terminal T21 and isolation terminal T22 (including a portion between the coupling terminal T21 and ground terminal T23 and a portion between the isolation terminal T22 and ground terminal T23) is referred to as "sub line".

Length of the first and second lines L1 and L2 are determined depending on specification of the coupler 1. For example, the length may be set such that the coupler 1 serves as a quarter-wavelength (λ/4) resonator circuit for a target transmission signal (signal passing through the first line L1).

With reference to FIG. 1, basic operation of the coupler 1 will be described. A signal to be picked up by the coupler 1 is input to the input terminal T11 and output from the output terminal T12. When the signal is input to the input terminal T11, a main current IM flows in the first line L1. When the main current flows in the first line L1, induced current IL based on the magnetic coupling M flows in the second line L2 in one direction, and displacement current IC based on the capacitive couplings C1 and C2 flows in the second line L2 in two opposite directions. The resulting current flowing in the second line L2 is the sum of the induced current IL and the displacement current IC, and as a result, current (current directed to the coupling terminal T21) having directivity corresponding to a flowing direction of the induced current IL flows. As described above, when a signal is input to the input terminal T11 of the coupler and output from the output terminal T12, a signal corresponding to a part of the above signal is output from the coupling terminal T21.

The coupler 1 is used, for example, for an output monitor of a power amplifier (PA). In such a case, the input terminal T11 of the coupler 1 is connected to an output terminal of the power amplifier, and the coupling terminal T21 of the coupler 1 is connected to an input terminal of the power amplifier through an AGC detection circuit. With this configuration, a signal corresponding to a part of a signal output from the power amplifier is supplied from the coupling terminal T21 of the coupler 1 to the input terminal of the power amplifier as a feedback signal through the AGC detection circuit. The power amplifier performs output control based on the feedback signal to thereby allow an output gain thereof to be maintained constant.

Further, the coupler 1 can be used, for example, for control of an antenna tuner of a wireless communication device. In such a case, the input terminal T11 of the coupler 1 is connected to an output terminal of the antenna, and the coupling terminal T21 of the coupler 1 is connected to an antenna switch. With this configuration, a signal corresponding to a part of a signal output from the antenna is supplied from the coupling terminal T21 of the coupler 1 to the antenna switch as a feedback signal. The antenna tuner performs output control based on the feedback signal to thereby allow an output gain thereof to be maintained constant. The coupler 1 includes the thin-film resistive patterns R11 to R13 and R21 to R23 as the attenuators and can thus operate with high stability against impedance fluctuation even when the signal output from the antenna is a broadband signal.

Next, a specific configuration of the above-described coupler 1 will be described with reference to first to fourth embodiments.

First Embodiment

Figure 2:
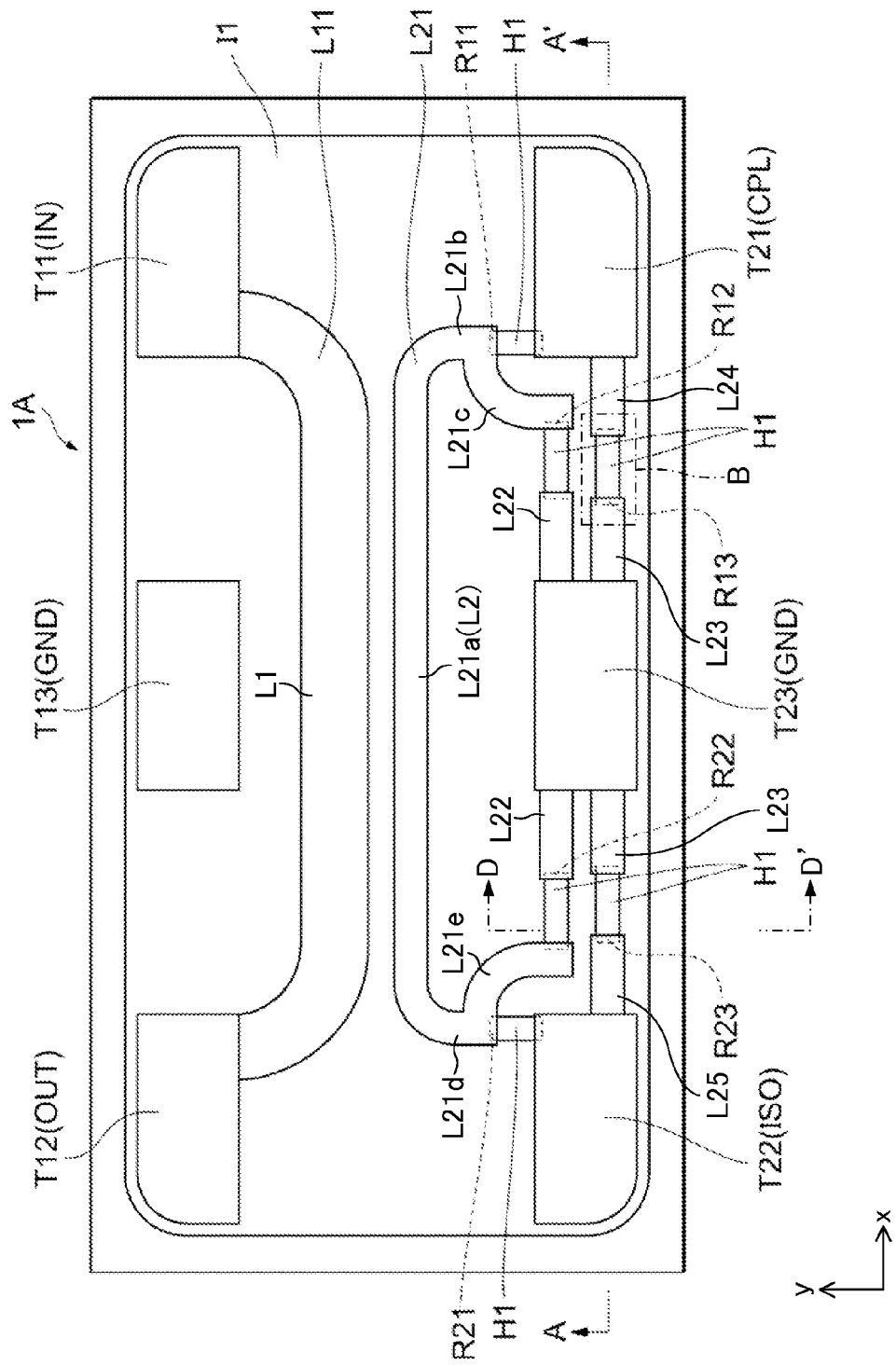
FIG. 2 is a plan view of a coupler 1A according to a preferred first embodiment of the present invention.
Figure 3:
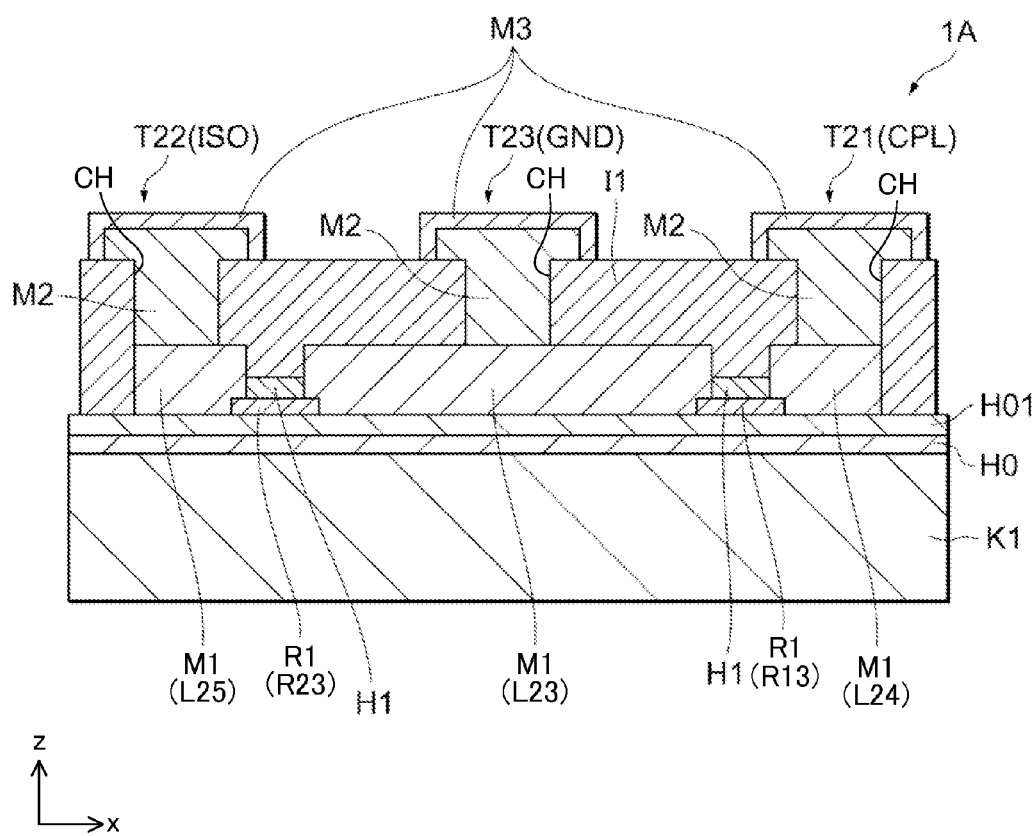
FIG. 3 is a vertical cross-sectional view taken along an A-A' line of FIG. 2.
Figure 4:
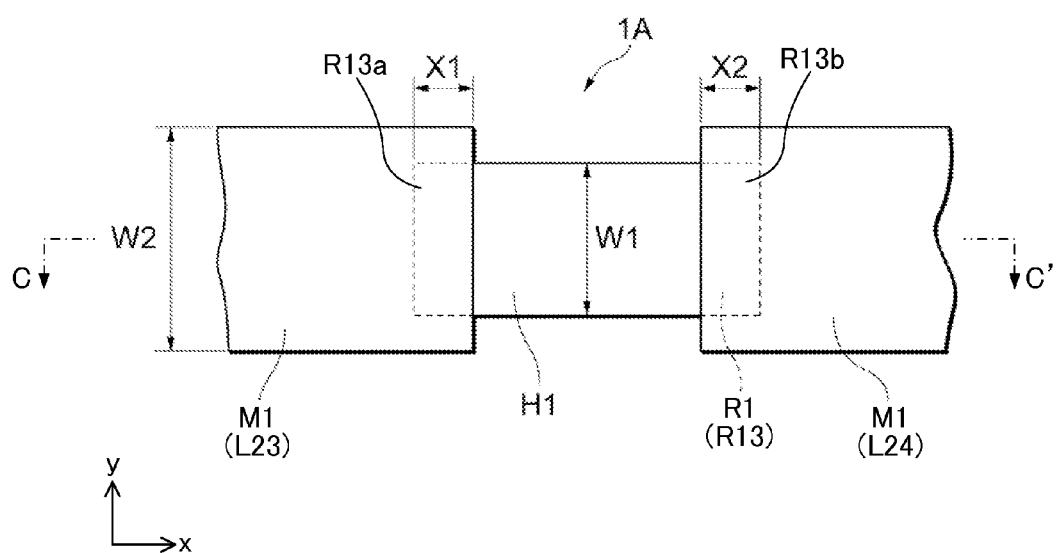
FIG. 4 is an enlarged view of an area B shown in FIG. 2.
Figure 5:
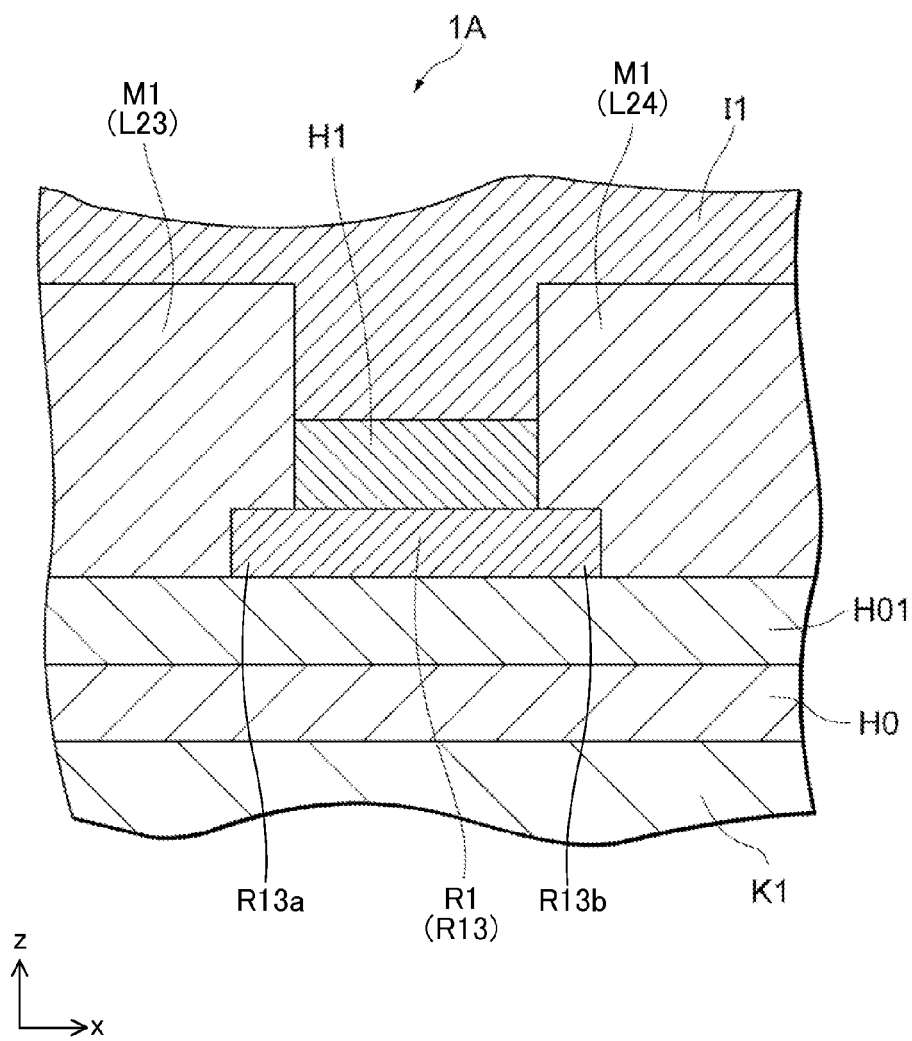
FIG. 5 is a vertical cross-sectional view taken along a C-C' line of FIG. 4.
Figure 6:
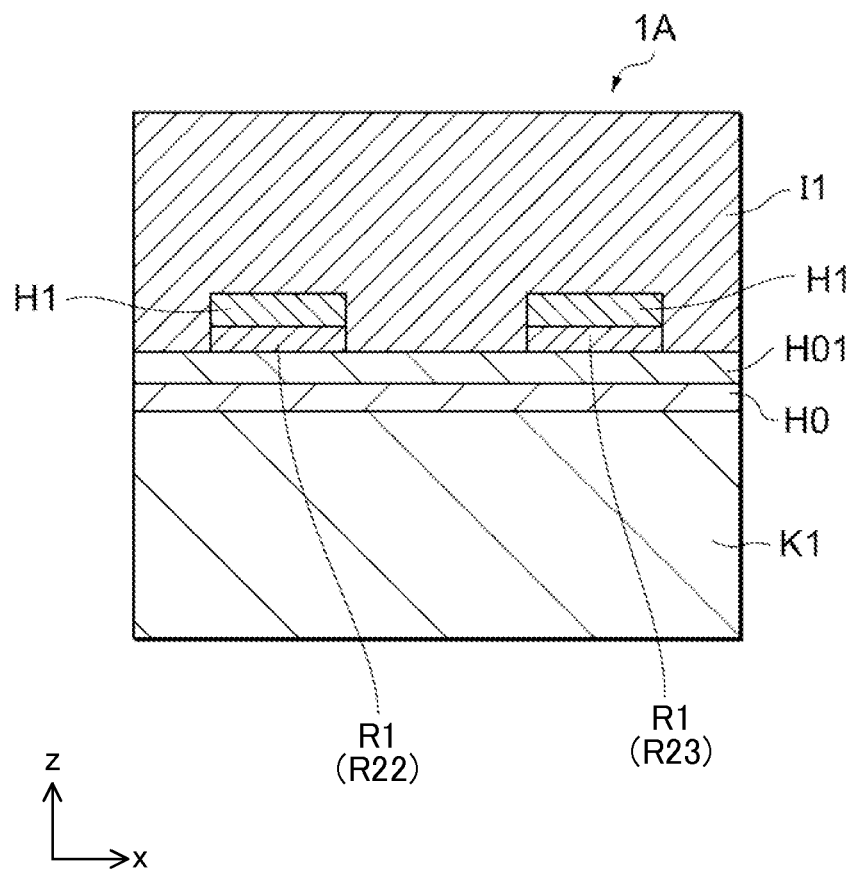
FIG. 6 is a vertical cross-sectional view taken along a D-D' line of FIG. 2.

FIG. 2 is a plan view of a coupler 1A according to a first embodiment of the present invention. FIG. 3 is a vertical cross-sectional view of the coupler 1A taken along an A-A' line of FIG. 2, FIG. 4 is an enlarged view of an area B shown in FIG. 2, FIG. 5 is a vertical cross-sectional view of the coupler 1A taken along a C-C' line of FIG. 4, and FIG. 6 is a vertical cross-sectional view of the coupler 1A taken along a D-D' line of FIG. 2.

As illustrated in FIG. 3, the coupler 1A has a structure in which a planarizing film H0 and an insulating film H01 are stacked in this order on the entire surface of a substrate K1 and, on an upper surface of the insulating film H01, the constituent elements illustrated in FIG. 1 are formed. In the present invention, sometimes the substrate K1, planarizing film H0, and insulating film H01 are collectively referred to as "substrate". The constituent elements to be described below are formed above the insulating film H01.

A planar configuration of the coupler 1A will be described with reference to FIG. 2. Hereinafter, as illustrated in FIG. 2, a long-side direction of the rectangular substrate K1 is referred to as "x-direction", and a short-side direction thereof is as "y-direction".

The input terminal T11 and output terminal T12 are disposed at one corner and the other corner of one long side of the substrate K1, respectively. The ground terminal T13 is disposed between the input terminal T11 and output terminal T12. The coupling terminal T21 and isolation terminal T22 are disposed at one corner and the other corner of the other long side of the substrate K1, respectively. The ground terminal T23 is disposed between the coupling terminal T21 and isolation terminal T22.

Wiring patterns L11 and L21 to L25, each of which is a conductive film, and thin-film resistive patterns R11 to R13 and R21 to R23, each of which is a resistive film, are formed on the upper surface of the insulating film H01 (FIG. 3).

The wiring pattern L11 constitutes the above-described main line and is disposed so as to connect the input terminal T11 and output terminal T12 while curving toward a center of the substrate K1 in order to keep away from the ground terminal T13. The wiring pattern L11 has, near the center of the substrate K1, a linear portion extending in the x-direction. This linear portion constitutes the first line L1 illustrated in FIG. 1.

The wiring patterns L21 to L25 and thin-film resistive patterns R11 to R13 and R21 to R23 constitute the above-described sub line. Specifically, the wiring pattern L21 has a linear portion L21a extending in parallel to the linear portion (first line L1) of the wiring pattern L11, a first portion L21b curving from one end (end portion near the coupling terminal T21) of the linear portion L21a toward the coupling terminal T21 and finally extending in the y-direction, a second portion L21c extending in the x-direction from a leading end of the first portion L21b toward the ground terminal T23, curving in a direction toward an outside of the substrate K1 in the middle thereof, and finally extending in the y-direction, a third portion L21d curving from the other end (end portion near the isolation terminal T22) of the linear portion L21a toward the isolation terminal T22 and finally extending in the y-direction, and a fourth portion L21e extending in the y-direction from a leading end of the third portion L21d toward the ground terminal T23, curving in a direction toward the outside of the substrate K1 in the middle thereof, and finally extending in the y-direction. The linear portion L21a constitutes the second line L2 illustrated in FIG. 1 and is electromagnetically coupled to the linear portion of the wiring pattern L11. Leading ends of the respective second and fourth portions L21c and L21e constitute both ends of the wiring pattern L21, respectively. The leading end (connection end to the second portion L21c) of the first portion L21b is electrically connected to the coupling terminal T21 through the thin-film resistive pattern R11. The leading end (connection end to the fourth portion L21e) of the third portion L21d is electrically connected to the isolation terminal T22 through the thin-film resistive pattern R21.

The wiring pattern L22 is a linear pattern passing under the ground terminal T23 and extending in the x-direction. One end (end portion near the coupling terminal T21) of the wiring pattern L22 is electrically connected to a leading end of the second portion L21c of the wiring pattern L21 through the resistive film R12. The other end (end portion near the isolation terminal T22) of the wiring pattern L22 is electrically connected to a leading end of the fourth portion L21e of the wiring pattern L21 through the resistive film R22.

The wiring pattern L23 is a linear pattern passing under the ground terminal T23 and extending in parallel to the wiring pattern L22 at a position closer to an edge of the substrate K1 than the wiring pattern L23. A length of the wiring pattern L22 is slightly shorter than that of the wiring pattern L23. The wiring pattern L24 is a linear pattern having one end connected to the coupling terminal T21 and the other end disposed so as to face one end of the wiring pattern L23. The other end of the wiring pattern L24 and one end of the wiring pattern L23 are electrically connected to each other through the thin-film resistive pattern R13. The wiring pattern L25 is a linear pattern having one end connected to the isolation terminal T22 and the other end disposed so as to face the other end of the wiring pattern L23. The other end of the wiring pattern L25 and the other end of the wiring pattern L23 are electrically connected to each other through the thin-film resistive pattern R23.

Next, a three-dimensional configuration of the coupler 1A will be described with reference to FIG. 3. Although the following descriptions will be made based on FIG. 3, portions other than those illustrated in FIG. 3 have the similar configuration.

As described above, the planarizing film H0 and insulating film H01 are stacked in this order on the entire surface of the substrate K1. It is preferable to select, as the substrate K1, one from various substrates such as an alumina substrate, a glass substrate, a ferrite substrate, and an aluminum nitride substrate. It is preferable to select, as the planarizing film H0, an alumina film or a silica film. When the planarizing film H0 is formed of the alumina film, a sputtering method or the like is used to form the alumina film on the surface of the substrate K1 and, then, a CMP (Chemical Mechanical Polishing) is performed to planarize a surface of the formed alumina film, whereby the insulating film H01 which is the alumina film is obtained. When the planarizing film H0 is formed of the silica, it is preferable to use so-called a spin-on glass method to form the planarizing film H0. In this case, there is no need to perform the CMP for planarizing the surface of the planarizing film H0. It is preferable to select, as the insulating film H01, a silicon nitride film or an alumina film. The insulating film H01 is provided for maintaining an electric conductivity of the surface at a sufficiently low value. When it is possible to maintain the surface electric conductivity at a sufficiently low value only with the planarizing film H0, the insulating film H01 need not be provided.

The thin-film resistive patterns R13 and R23 are formed of a resistive film R1 formed on the surface of the insulating film H01. As a material of the resistive film R1, tantalum nitride, a nickel chrome alloy, or the like is preferably used. The wiring patterns L23 to L25 are each formed of a conductive film M1 formed on the surface of the insulating film H01. As a material of the conductive film M1, Cu, Ag, Pd, Ag—Pd, Ni, Au, or the like is preferably used.

With reference to FIGS. 4 and 5, a connection structure between the thin-film resistive pattern R13 (first resistive film pattern) and each of the wiring patterns L23 and L24 (first and second wiring patterns) will be described in detail. Although the following descriptions will be made with respect to the thin-film resistive pattern R13 and wiring patterns L23, L24, connections between the other thin-film resistive patterns and other wiring patterns are realized by a similar structure.

As illustrated in FIG. 4, the thin-film resistive pattern R13 is connected to the wiring pattern L23 at its one end portion R13a (portion distanced from one end surface by a length X1: first end portion) and is connected to the wiring pattern L24 at its one end portion R13b (portion distanced from the other end surface by a length X2: second end portion). A wiring width W1 of the thin-film resistive pattern R13 is set smaller than a wiring width W2 of each of the wiring patterns L23 and L24.

As illustrated in FIG. 5, the one end portion R13a is disposed so as to be fitted into between the wiring pattern L23 and substrate (insulating film H01). With this configuration, an upper surface, end surface (x-direction side surface), and width-direction both side surfaces (y-direction both side surfaces) of the one end portion R13a contact the wiring pattern L23. Similarly, the other end portion R13b is disposed so as to be fitted into between the wiring pattern L24 and substrate (insulating film H01). With this configuration, an upper surface, end surface (x-direction side surface), and width-direction both side surfaces (y-direction both side surfaces) of the other end portion R13b contact the wiring pattern L24.

Specific values of the x-direction lengths X1 and X2 of the one end portion R13a and the other end portion R13b are each set to a sufficiently smaller value than extension of each of the wiring patterns L23 and L24. The same is applied to the thin-film resistive patterns other than the thin-film resistive pattern R13, so that a most part of a lower surface of the conductive film M1 is not covered by the resistive film R1 and contacts the insulating film H01 directly, as illustrated in FIG. 3.

A part of the upper surface of the thin-film resistive pattern R13 that does not contact the wiring patterns L23 and L24 is covered by an insulating film H1 as illustrated in FIGS. 4 and 5. The insulating film H1 is a film for preventing the resistive film R1 from being oxidized during a manufacturing process and is preferably formed of a silicon nitride film or an alumina film like the insulating film H01. In the present embodiment, as illustrated in FIG. 6, the insulating film H1 is not provided at the width-direction side surfaces of each thin-film resistive pattern (resistive film R1).

Referring back to FIG. 3, a film thickness of the conductive film M1 is set to a value larger than a sum of the film thickness of the resistive film R1 and that of the insulating film H1. Thus, as illustrated in FIG. 3, an upper surface of the insulating film H1 is positioned at a lower level than an upper surface of the conductive film M1.

A protective film I1 is formed as an upper layer of the insulating film H1 and conductive film M1. As illustrated in FIG. 6, the protective film I1 covers also the width-direction side surfaces of each thin-film resistive pattern (resistive film R1). The protective film I1 is a film for protecting the constituent elements to be covered thereby and is formed of an inorganic insulator such as silicon nitride, aluminum oxide, or silicon dioxide, or an organic insulator such as polyimide or epoxy resin.

As illustrated in FIG. 3, the protective film I1 has a contact hole CH at a position corresponding to each terminal. The conductive film M1 is exposed from the contact hole CH. A conductive film M2 is embedded inside the contact hole CH, and the conductive film M2 contacts the conductive film M1 at its lower surface. The conductive film M2 may be formed of the same material as that of the conductive film M1. The conductive film M2 is formed up to a position higher than an upper end of the contact hole CH, and a planar size of the portion positioned higher than the upper end of the contact hole CH is larger than a sectional area of the contact hole CH. A surface of a part of the conductive film M2 positioned outside the contact hole CH is covered by a plated film M3. As the plated film M3, Ni/Au plating or Ni/Sn plating can be preferably used. As illustrated in FIG. 3, the coupling terminal T21, isolation terminal T22, and ground terminal T23 are constituted by the conductive film M2 and conductive film M3.

The structure of the coupler 1A described above will be described again in a different viewpoint.

As illustrated in FIG. 2, the wiring pattern L11 (main line) is connected to the input terminal T11 and output terminal T12 and disposed opposite to the second line L2 in the same plane. This configuration allows the wiring pattern L11 to be electromagnetically coupled to the second line L2. The second line L2 is connected to the coupling terminal T21, isolation terminal T22, and ground terminal T23 through the thin-film resistive patterns R11 to R13 and R21 to R23.

As illustrated in FIG. 3, the planarizing film H0 and insulating film H01 are formed on the substrate K1. The insulating film H01 need not be provided when sufficient insulation can be ensured without it. The thin-film resistive patterns R13 and R23 are formed on the insulating film H01. The insulating film H1 is formed so as to cover only a part of each of the thin-film resistive patterns R13 and R23 other than the connection portion thereof to the conductive film M1 (wiring layer) and the conductive film M1 is formed on a part of each of the thin-film resistive patterns R13 and R23 that is not covered by the insulating film H1. The protective film I1 is formed on the conductive film M1 and insulating film H1. The terminals T21, T22, and T23 are formed by a laminated body of the conductive film M1 and conductive film M2 (terminal). The plated film M3 is formed on surfaces of the terminals T21, T22, and T23.

As illustrated in FIGS. 4 and 5, the width W1 of the thin-film resistive pattern R13 is smaller than the width W2 of the conducting film M1, and the thin-film resistive pattern R13 is covered by the conductive film M1 at its left- and right-side end portions and upper surface portions having lengths of X1 and X2, respectively (i.e., end portions R13a and R13b). Only the upper surface of the thin-film resistive pattern R13 excluding the above connection portion is covered by the insulating film H1.

Next, effects produced by the coupler 1A according to the present embodiment will be described. Prior to description, a coupler according to a background art of the present invention will be described briefly, and then effects produced by the coupler 1A will be described while comparing the coupler of the background art.

Figure 18:
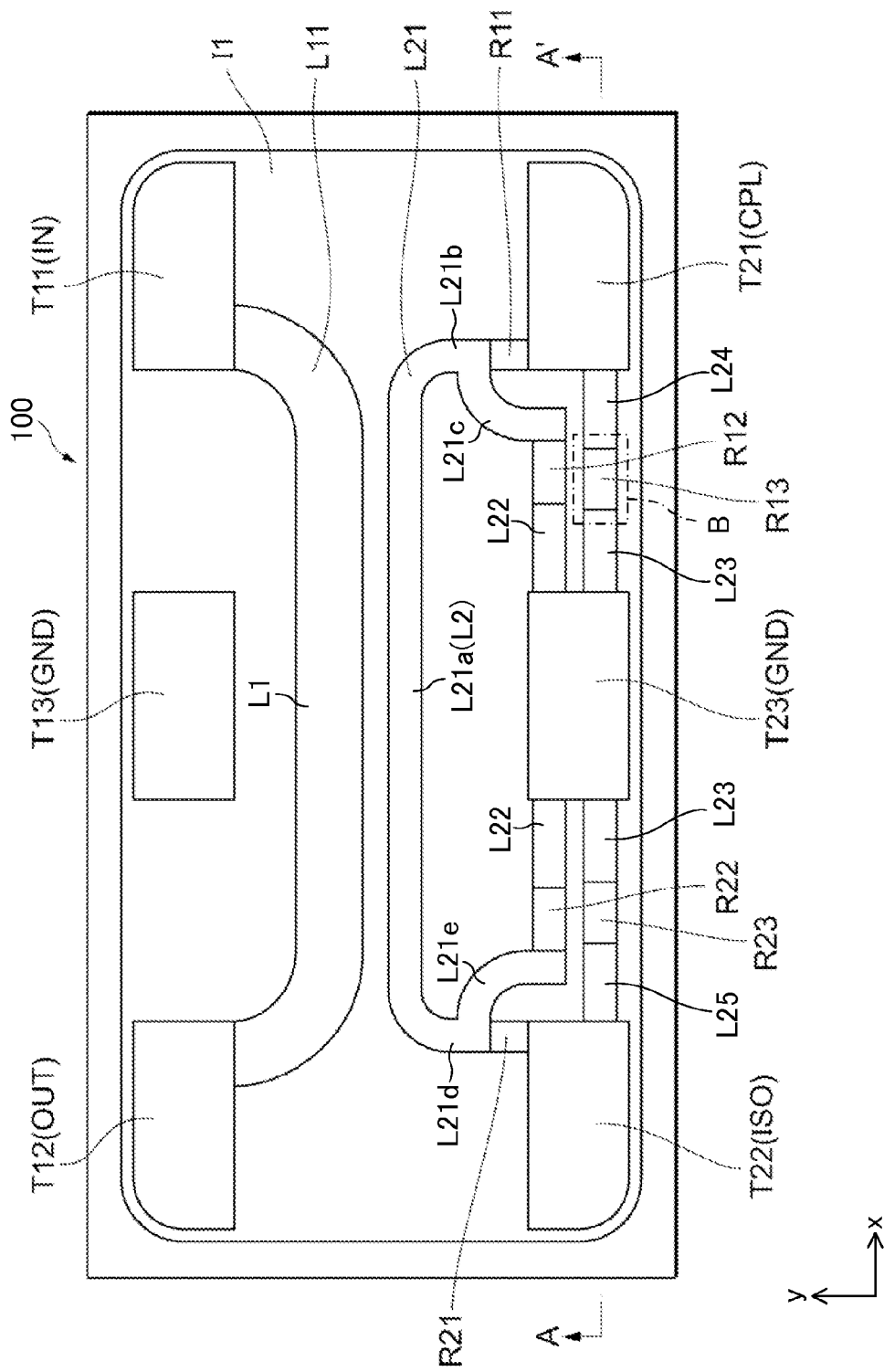
FIG. 18 is a plan view of a coupler 100 according to a background art of the present invention.
Figure 19:
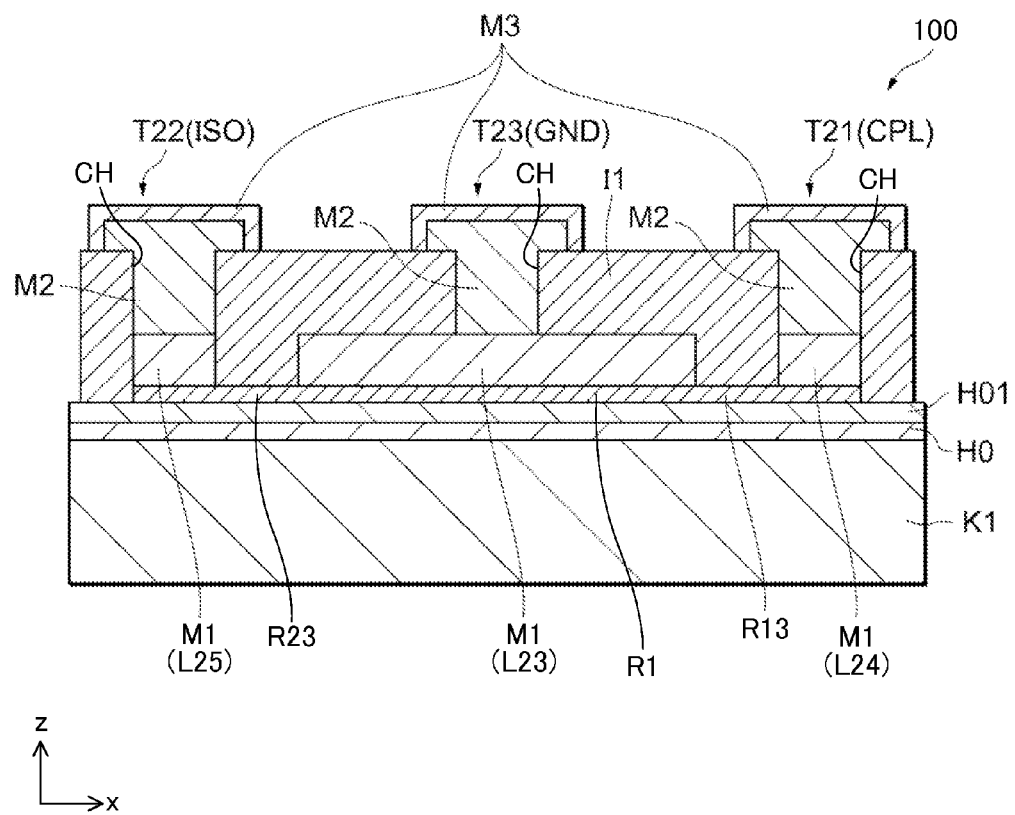
FIG. 19 is a vertical cross-sectional view taken along an A-A' line of FIG. 18.
Figure 20:
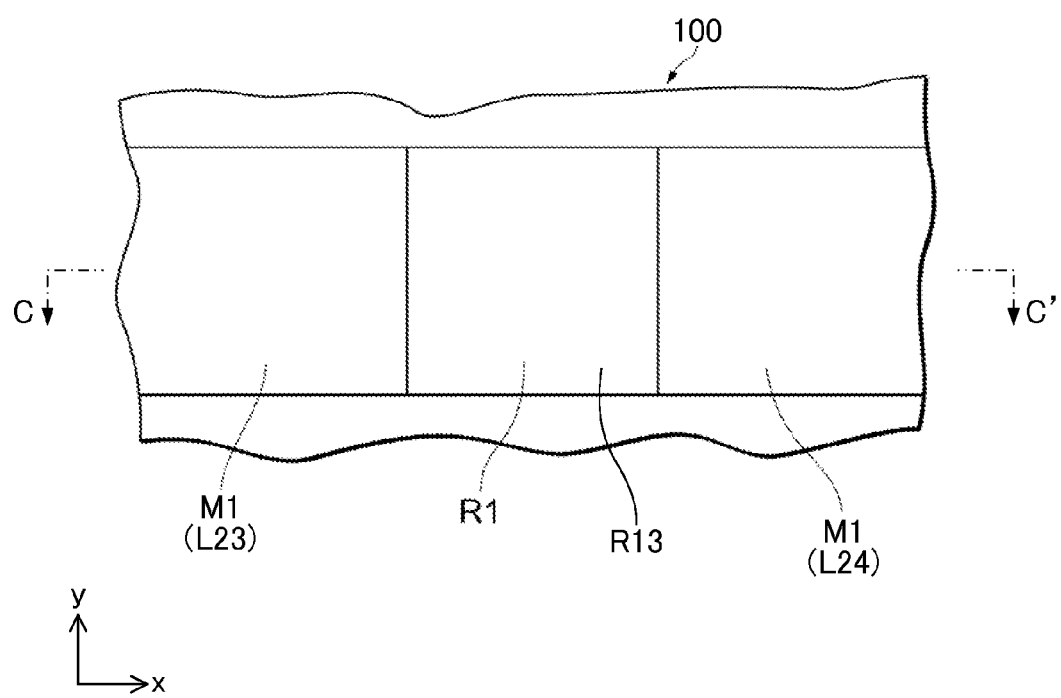
FIG. 20 is an enlarged view of an area B shown in FIG. 18.
Figure 21:
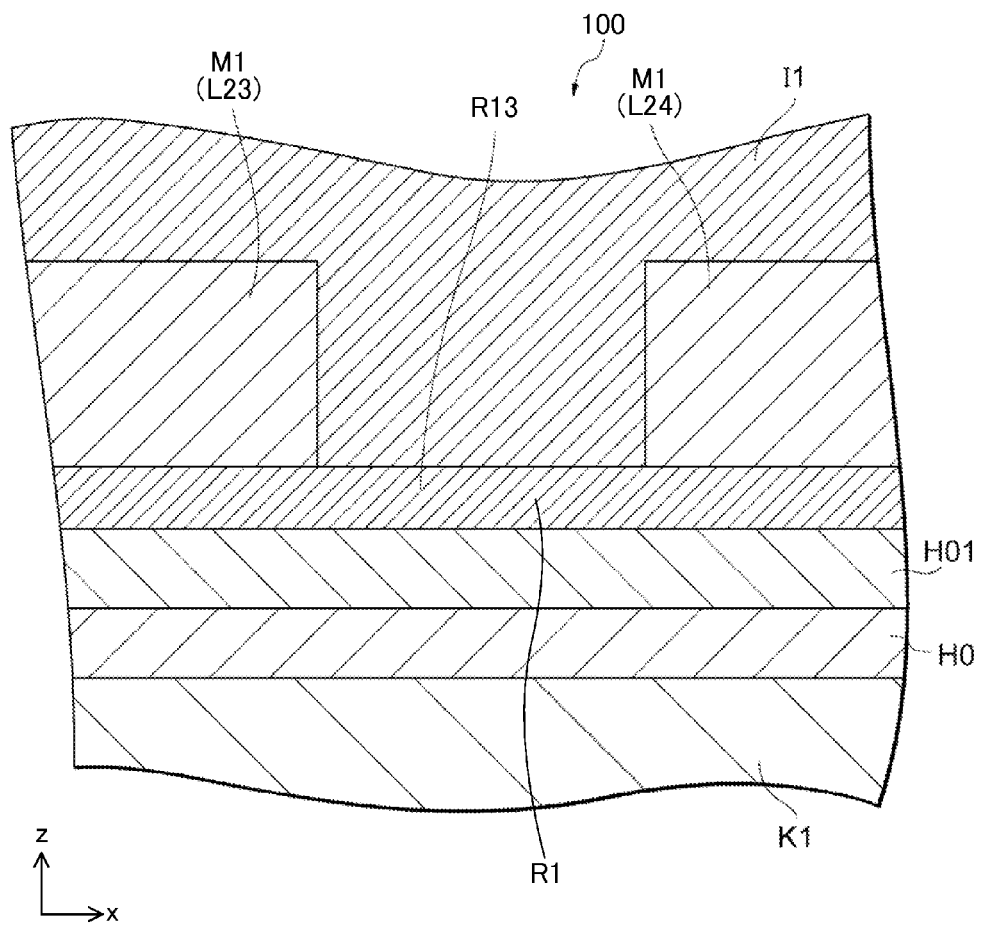
FIG. 21 is a vertical cross-sectional view taken along a C-C' line of FIG. 20.

FIG. 18 is a plan view of a coupler 100 according to a background art of the present invention. FIG. 19 is a vertical cross-sectional view of the coupler 100 taken along an A-A' line of FIG. 18, FIG. 20 is an enlarged view of an area B shown in FIG. 18, and FIG. 21 is a vertical cross-sectional view of the coupler 100 taken along a C-C' line of FIG. 20. As is clear from a comparison between FIGS. 18 to 21 and FIGS. 2 to 5, the coupler 100 differs from the coupler 1A according to the first embodiment in that the entire lower surface of the conductive film M1 is covered by the resistive film R1, that the insulating film H1 is not provided, and that the wiring width of each thin-film resistive pattern is equal to the wiring width of each wiring pattern.

A configuration of the coupler 100 will be described more in detail. In the coupler 100, the wiring pattern L11 (main line) is connected to the input terminal T11 and output terminal T12 and disposed opposite to the second line L2 in the same plane. This configuration allows the wiring pattern L11 to be electromagnetically coupled to the second line L2. The second line L2 is connected to the coupling terminal T21, isolation terminal T22, and ground terminal T23 through the thin-film resistive patterns R11 to R13 and R21 to R23. With this configuration, the thin-film resistive patterns R11 to R13 and R21 to R23 function as the attenuators, respectively.

The resistive film R1 in the coupler 100 is integrally formed over the entire lower surface of the wiring pattern L11 (main line) and wiring patterns L21 to L25 (part of the sub line). The thin-film resistive patterns R11 to R13 and R21 to R23 in the coupler 100 each constitute a part of the resistive film R1.

Also in the coupler 100, the planarizing film H0 and insulating film H01 are formed on the entire surface of the substrate K1. The resistive film R1 is formed on the insulating film H01, and the conductive film M1 (wiring layer) is formed on the insulating film H01. The protective film 11 is formed on the conductive film M1. The terminals T21, T22, and T23 are formed by a laminated body of the conductive film M1 and conductive film M2. The plated film M3 is formed on the surfaces of the terminals T21, T22, and T23.

Now, effects produced by the coupler 1A according to the present embodiment will be described. According to the coupler 1A, the conductive film M1 has a part of its lower surface that is not covered by the resistive film R1, making it possible to reduce influence brought about by flowing of current in the resistive film R1 which is caused due to the skin effect, as compared to the coupler 100 in which the entire lower surface of the conductive film M1 is covered by the resistive film R1. Thus, the frequency-dependent difference in the attenuation amount of the current signal in the coupler 1A is reduced as compared to that of the current signal in the coupler 100.

In other words, in the coupler 100, the resistive film R1 exists on the entire surface of the conductive film M1 and contacts the entire lower surface of the conductor film M1, so that, especially in a high-frequency region, part of current flowing in the conductive film M1 also is made to flow in the resistive film R1 formed under the conductive film M1 due to the skin effect. This causes high-frequency loss. On the other hand, in the coupler 1A according to the first embodiment, the resistive film R1 and conductive film M1 are fully separated from each other by the insulating film H1 at a portion other than the connection portion between each thin-film resistive pattern and conductive film M1 to be electrically isolated from each other, whereby the above high-frequency loss can be prevented.

Further, in the coupler 1A, the end portion of each thin-film resistive pattern contacts the conductive film M1 at its upper surface, end surface, and width-direction side surfaces, so that contact resistance between the conductive film M1 and resistive film R1 can be reduced as compared to a conventional example (e.g., configuration illustrated in FIG. 5 of Patent Document 3) in which the end portion of each thin-film resistive pattern contacts the conductive film only at its end surface.

Besides, unlike the coupler 100, the coupler 1A has a configuration in which the upper surface of each thin-film resistive pattern is covered by the insulating film H1, thus making it possible to prevent the resistive film R1 from being oxidized during a manufacturing process, which in turn can prevent degradation of the resistive film R1. As a result, a location-dependent variation in a resistance value of the resistive film R1 in the substrate surface can be reduced.

Forming the insulating film H01 and insulating film H1 using the silicon nitride film or an alumina film also contributes to the prevention of oxidization of the resistive film R1. That is, an inorganic material like the silicon nitride film or alumina film has low responsiveness to the resistive film R1, so that forming the insulating film H01 and insulating film H1 using the silicon nitride film or an alumina film prevents oxidization of the resistive film R1.

The insulating film H1 has a heat radiation effect and an ESD resistance enhancing effect. The enhancement of the ESD resistance means that it is possible to obtain an effect of preventing progress of degradation of the resistive film R1 due to an input of static electricity. Thus, also from this point of view, it can be said that, in the coupler 1A, a location-dependent variation in a resistance value of the resistive film R1 in the substrate surface can be reduced.

Further, in the coupler 1A, the wiring width of the resistive film R1 (thin-film resistive pattern) is set to a value smaller than the wiring width of the conductive film M1 (wiring pattern), so that even if a relative position between the resistive film R1 and conductive film M1 is slightly displaced from each other in the width direction, a contact area between the resistive film R1 and conductive film M1 can be maintained constant.

Second Embodiment

Figure 7:
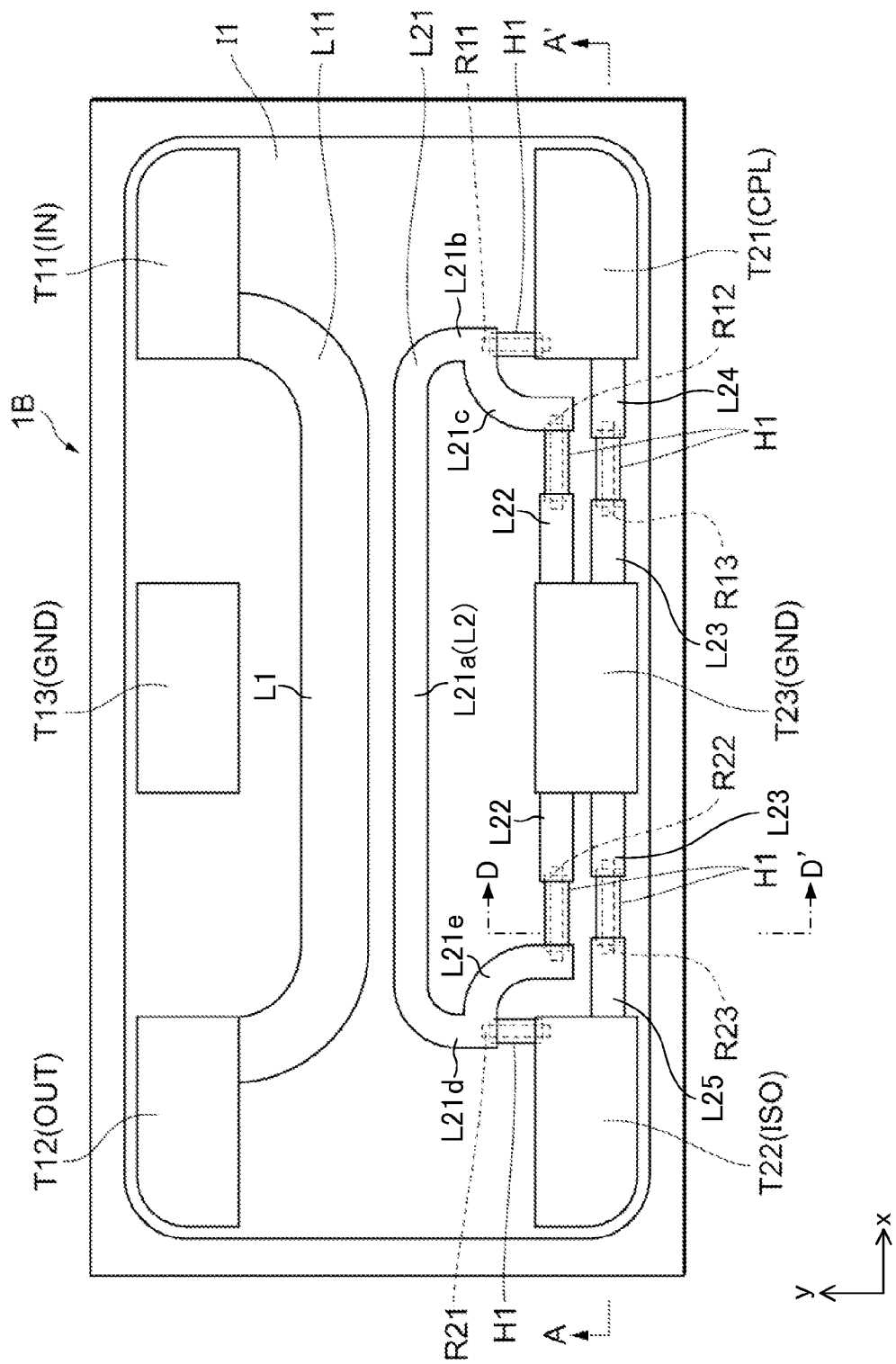
FIG. 7 is a plan view of a coupler 1B according to a preferred second embodiment of the present invention.
Figure 8:
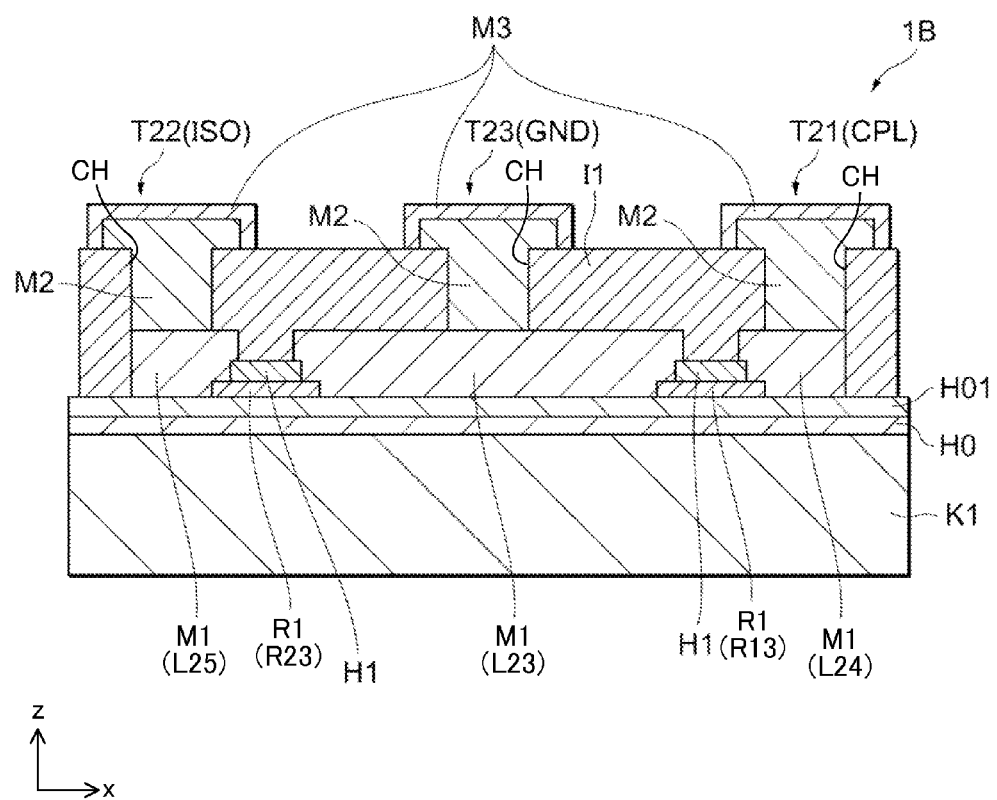
FIG. 8 is a vertical cross-sectional view taken along an A-A' line of FIG. 7.

FIG. 7 is a plan view of a coupler 1B according to a second embodiment of the present invention. FIG. 8 is a vertical cross-sectional view of the coupler 1B taken along an A-A' line of FIG. 7, and FIG. 9 is a vertical cross-sectional view of the coupler 1B taken along a D-D' line of FIG. 7.

The coupler 1B according to the present embodiment differs from the coupler 1A according to the first embodiment in that the insulating film H1 covers not only the upper surface of the resistive film R1 but also the width-direction (direction perpendicular to a direction in which two wiring patterns corresponding to the resistive film R1 face each other) side surfaces thereof and that the insulating film H1 is formed so as to extend up to between the conductive film M1 and resistive film R1. Other configurations are the same as those of the coupler 1A according to the first embodiment, so the following description will be made with respect to the different points.

Figure 9:
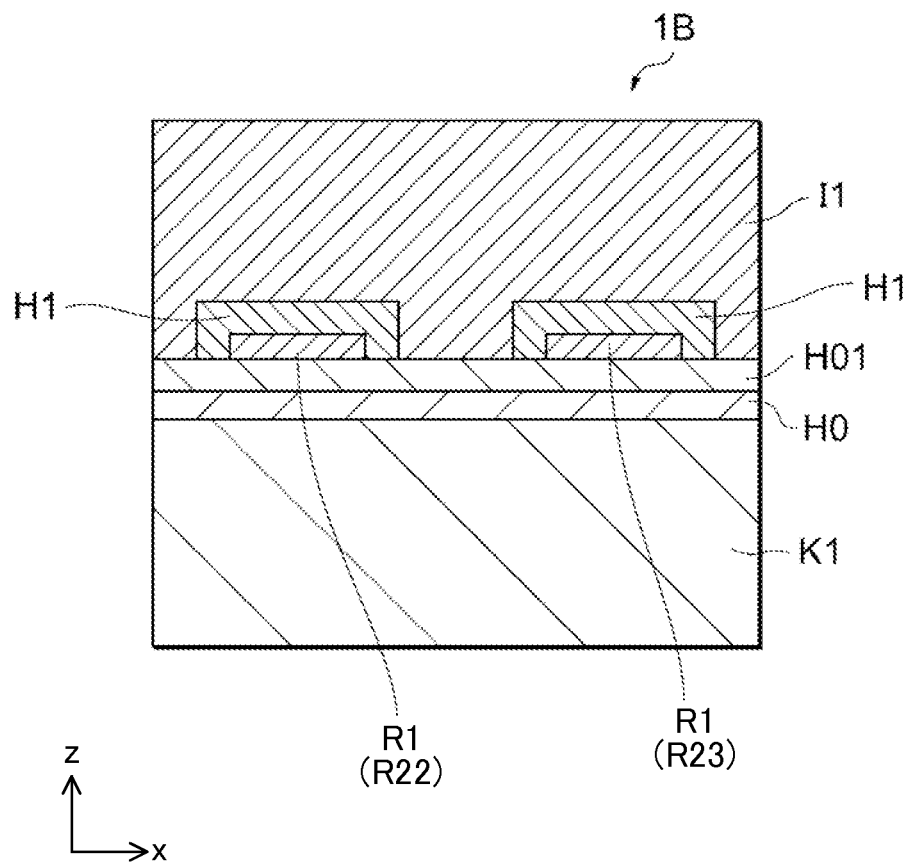
FIG. 9 is a vertical cross-sectional view taken along a D-D' line of FIG. 7.

As is clear from a comparison between FIG. 6 and FIG. 9, the insulating film H1 of the coupler 1A covers only the upper surface of the resistive film R1 and does not cover the side surfaces (width-direction side surfaces) thereof, while the insulating film H1 of the coupler 1B covers not only the upper surface of the resistive film R1 but also the side surfaces (width-direction side surfaces) thereof. Thus, in the present embodiment, not only the upper surface of the resistive film R1 but also the width-direction side surfaces thereof are covered by the insulating film H1, whereby degradation of the resistive film due to oxidization during the manufacturing process can be prevented more reliably.

Further, as illustrated in FIGS. 7 and 8, the insulating film H1 of the present embodiment is formed so as to extend up to between the conductive film M1 and resistive film R1. This allows patterning of the insulating film H1 to be performed before film formation of a conductive material to serve as the conductive film M1. That is, designing the insulating film H1 so as to extend up to between the conductive film M1 and resistive film R1 can prevent the resistive film R1 from being exposed after patterning of the conductive material if there occurs a displacement between a pattern of the insulating film H1 and the wiring pattern. Therefore, the pattering of the insulating film H1 can be performed before the film formation of the conductive material.

However, in such a design, it is necessary to prevent the upper surface (part of each thin-film resistive pattern to be made to contact the conductive film M1) of the end portion of each thin-film resistive pattern from being covered by the insulating film H1. If the entire upper surface and entire width-direction side surfaces of the thin-film resistive pattern are covered by the insulating film H1, it is impossible to reduce the contact resistance between the conductive film M1 and resistive film R1.

As described above, the coupler 1B of the present embodiment has a structure in which the insulating film H1 covers, excluding the connection portion between each thin-film resistive pattern and conductive film M1, the side surfaces of the each thin-film resistive pattern, in addition to the upper surface thereof, so that it is possible to prevent the resistive film R1 from being oxidized immediately after formation of the insulating film H1 more reliably in addition to the effects obtained by the coupler 1A of the first embodiment. As a result, a location-dependent variation in a resistance value of the resistive film R1 in the substrate surface can be reduced.

Further, according to the coupler 1B, the manufacturing process therefor can be configured such that the patterning of the insulating film H1 is performed before film formation of a conductive material to serve as the conductive film M1.

Third Embodiment

Figure 10:
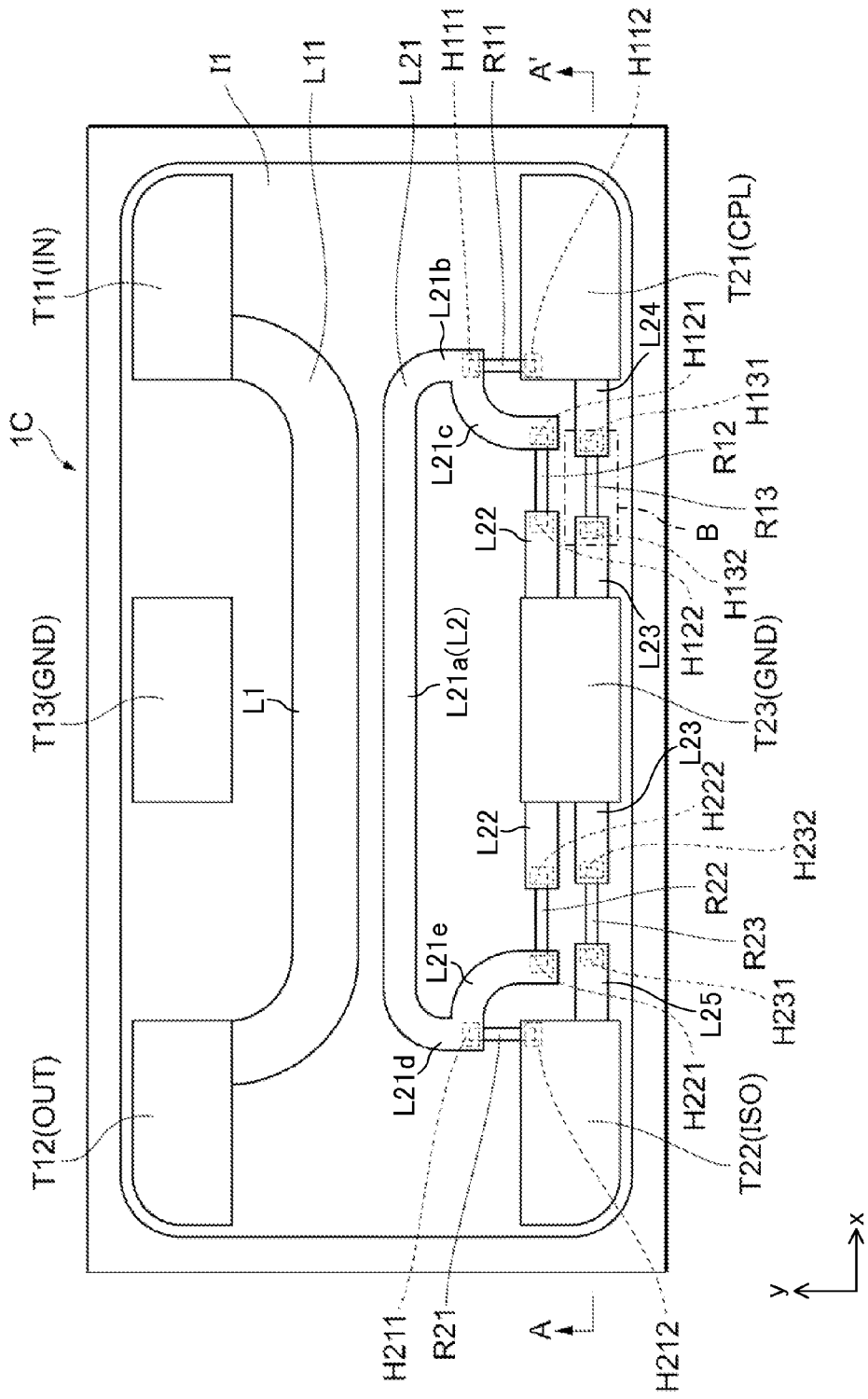
FIG. 10 is a plan view of a coupler 1C according to a preferred third embodiment of the present invention.
Figure 11:
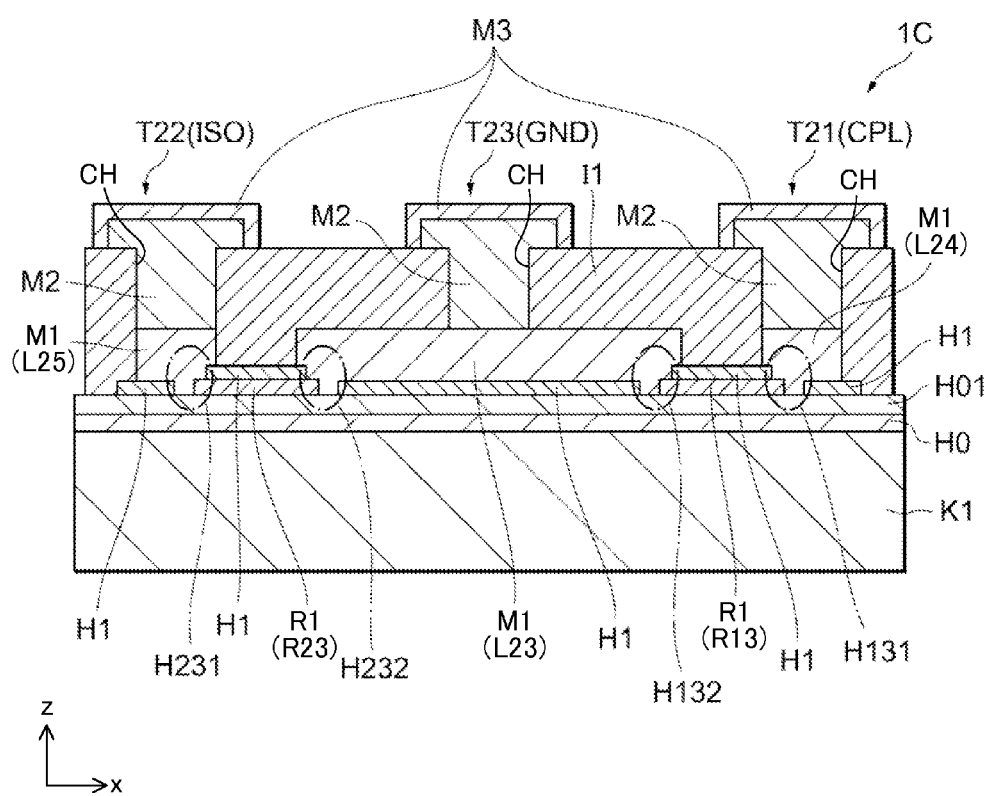
FIG. 11 is a vertical cross-sectional view taken along an A-A' line of FIG. 11.

FIG. 10 is a plan view of a coupler 1C according to a third embodiment of the present invention. FIG. 11 is a vertical cross-sectional view of the coupler 1C taken along an A-A' line of FIG. 11, FIG. 12 is an enlarged view of an area B shown in FIG. 10, and FIG. 13 is a vertical cross-sectional view of the coupler 1C taken along a C-C' line of FIG. 12.

The coupler 10 according to the present embodiment differs from the coupler 1B according to the second embodiment in that the insulating film H1 covers a large part of the lower surface of the conductive film M1. Other configurations are the same as those of the coupler 1B according to the second embodiment, so the following description will be made with respect to the different point.

Although details will be described later in explanation of a manufacturing process of the coupler 1C, the insulating film H1 according to the present embodiment is formed as follows: first, each thin-film resistive pattern is formed, then an insulating film material is formed on the thin-film resistive pattern, and finally, a plurality of though holes are formed in the insulating film material. As the plurality of through holes, through holes H111, H112, H121, H122, H131, H132, H211, H212, H221, H222, H231, and H232 shown in FIG. 10 are each formed at a position in which the end portion (end portion to be made to contact the conductive film M1) of each thin-film resistive pattern is exposed. The end portion of each thin-film resistive pattern and its corresponding wiring pattern contact each other inside the through hole.

Figure 12:
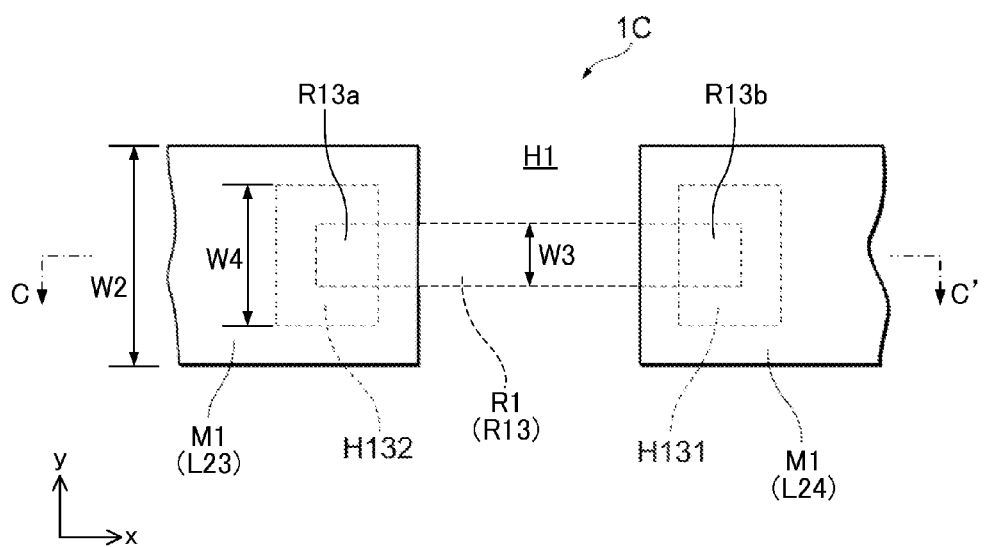
FIG. 12 is an enlarged view of an area B shown in FIG. 10.
Figure 13:
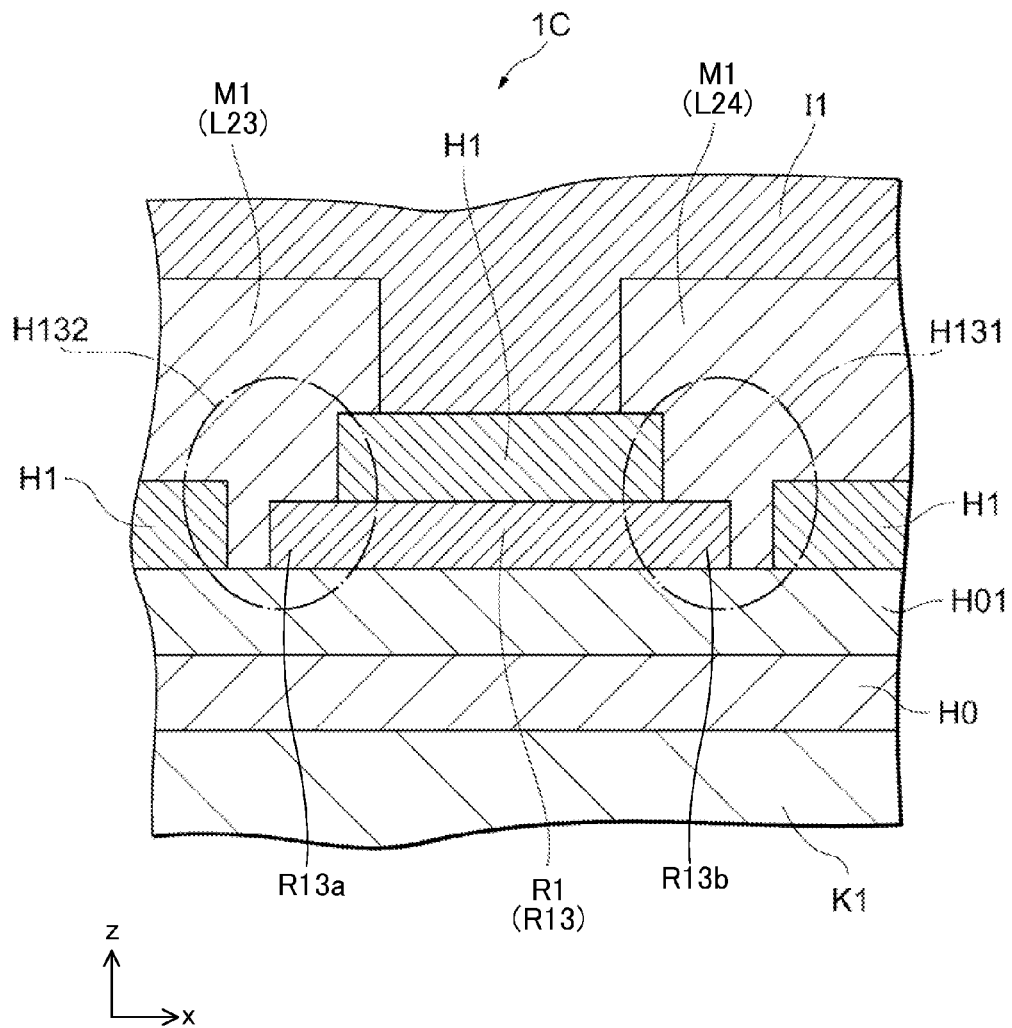
FIG. 13 is a vertical cross-sectional view taken along a C-C' line of FIG. 12.

With reference to FIGS. 12 and 13, a structure of the insulating film H1 according to the present embodiment will be described in detail taking the through holes H132 and H131 (first and second through holes) corresponding to both ends of the thin-film resistive pattern R13 (first resistive film pattern) as an example. Although not mentioned below, the structures of the insulating films H11 for other through holes are the same.

As illustrated in FIGS. 12 and 13, the through holes H132 and H131 are formed at positions in which an x-direction one end portion R13a (first end portion) of the thin-film resistive pattern R13 and an x-direction the other end 13b (second end portion) thereof are exposed. Further, as in the first and second embodiments, the conductive film M1 constituting the wiring patterns L23 and L24 is formed on the insulating film H1. The conductive film M1 constituting the wiring pattern L23 is formed also inside the through hole H132 and thus contacts the one end portion R13a of the thin-film resistive pattern R13 inside the through hole H132. Similarly, the conductive film M1 constituting the wiring pattern L24 is formed also inside the through hole H131 and thus contacts the other end portion R13b of the thin-film resistive pattern R13 inside the through hole H131.

Sizes and formation positions of the through holes H132 and H131 are set such that upper surfaces of the one end portion R13a and the other end portion R13b are exposed therethrough to some extent. In particular, y-direction (direction parallel to the width direction of the thin-film resistive pattern R13) widths W4 of the through holes H132 and H131 are each set to a value larger than a wiring width W3 of the thin-film resistive pattern R13 and smaller than a wiring width W2 of each of the wiring patterns L23 and L24. As a result, each end portion of the thin-film resistive pattern R13 contacts the corresponding conductive film M1 at its upper surface, end surface, and width-direction side surfaces.

Thus, also in the coupler 1C of the present embodiment configured as above, the frequency-dependent difference in the attenuation amount can be reduced as compared to that in the coupler 100 (FIGS. 14 to 17) having a structure in which the entire lower surface of the conductive film M1 is covered by the resistive film R1. Further, the end portion of the resistive film R1 (thin-film resistive pattern) contacts the conductive film M1 at its upper surface, end surface, and width-direction side surfaces, so that the contact resistance between the conductive film M1 and resistive film R1 can be reduced as compared to the conventional example having a structure in which the end portion of the resistive film R1 contacts the conductive film M1 only at its end surface.

Further, according to the coupler 1C of the present embodiment, it is possible to prevent the resistive film R1 from being oxidized immediately after formation of the insulating film H1 as in the case of the second embodiment. Thus, a location-dependent variation in a resistance value of the resistive film R1 in the substrate surface can be reduced.

Further, the resistive film R1 contacts the entire lower surface of the conductive film M1 in the coupler 100, while in the coupler 1C according to the present embodiment, the opening width W4 of the through hole is larger than the width W3 of the resistive film R1 (thin-film resistive pattern), so that the width W3 (which is one of the factors that determines a resistance value to a great degree) of the resistive film R1 can be made to fall within a range between a start point and an end point of each thin-film resistive pattern. Thus, according to the coupler 1C, a variation in a resistance value of the contact resistance between the conductive film M1 and resistive film R1 in the substrate surface can be reduced.

Further, in the coupler 1C according to the present embodiment, the insulating film H1 is formed using a thin-film insulating film, so that accuracy of patterning over a distance (which is one of the factors that determines a resistance value to a great degree) between the through holes corresponding to the start and end points of the thin-film resistive pattern is improved as compared to a case where the insulating film H1 is formed using a thick-film insulating film. Thus, a variation in a resistance value of the resistive film R1 in the substrate surface can be reduced as compared to a case where the insulating film H1 is formed using a thick-film insulating film. Further, a DC resistance component in each through hole and occurrence of high-frequency loss due to parasitic inductance can be reduced.

Further, the insulating film H1 is formed so as to cover a large part of the lower surface of the conductive film M1, so that a contact area between the insulating film H1 covering the thin-film resistive pattern and insulating film H01 formed under the resistive film R1 is increased. Thus, adhesion between the insulating film H1 and insulating film H01 is improved as compared to that in the coupler 1B according to the second embodiment, thereby suppressing peeling of the insulating film H1.

Next, a manufacturing process of the coupler 1C according to the present embodiment will be described.

Figure 14:
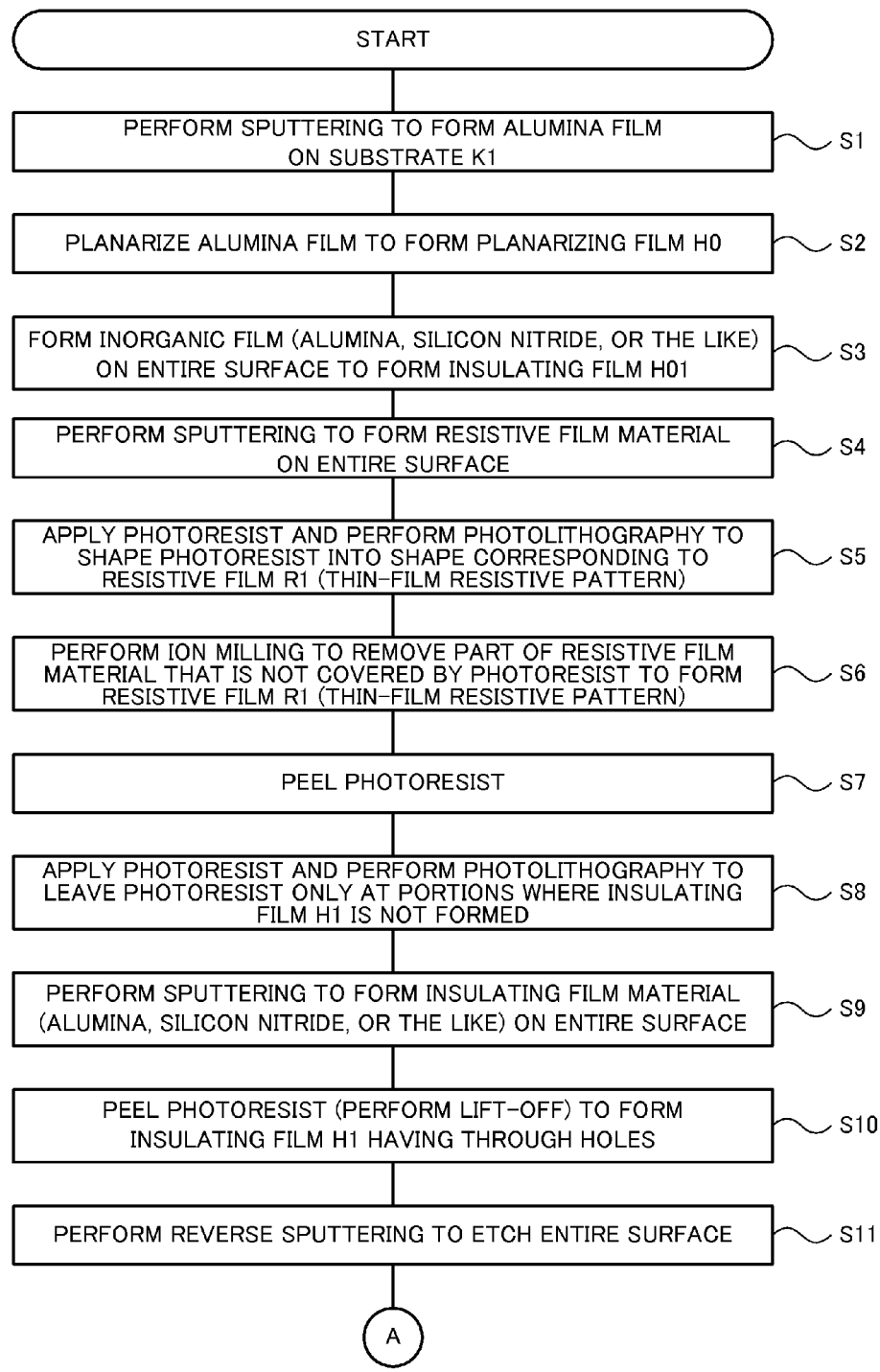
FIG. 14 is a flowchart illustrating steps S1 to S11 of the manufacturing process of the coupler 1C according to the preferred third embodiment of the present invention.
Figure 15:
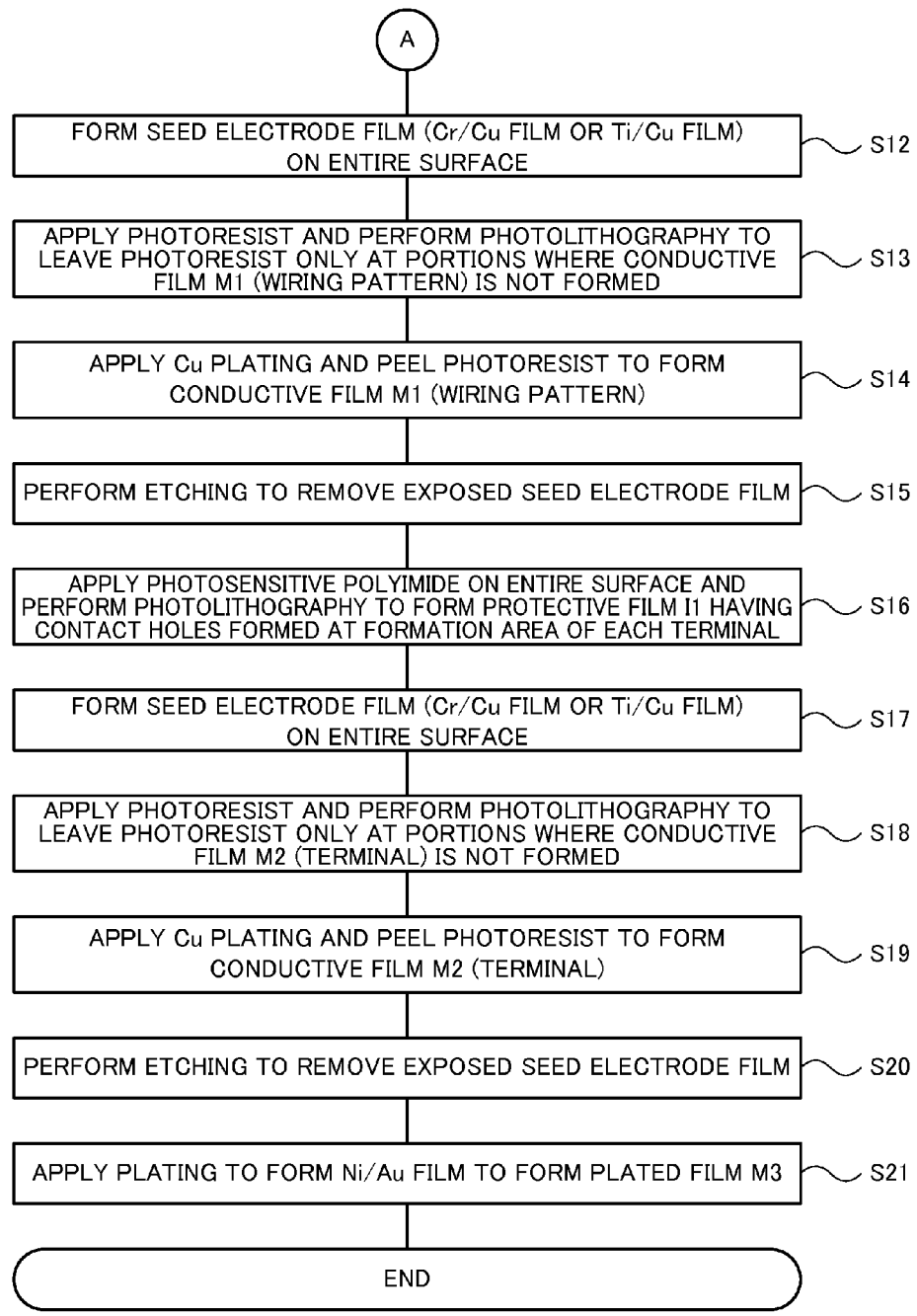
FIG. 15 is a flowchart illustrating steps S12 to S21 of the manufacturing process of the coupler 1C according to the preferred third embodiment of the present invention.

FIGS. 14 and 15 are each a flowchart illustrating the manufacturing process of the coupler 1C. As illustrated, in manufacturing the coupler 1C, first spattering is performed to form an alumina film on the substrate K1 (step S1). Then, the alumina film is planarized by CMP to form the planarizing film H0 (step S2). Thereafter, an inorganic film such as an alumina or silicon nitride is formed on the entire surface (step S3). As a result, the insulating film H01 is formed.

Next, the resistive film R1 (thin-film resistive pattern) is formed (steps S4 to S6). Specifically, a resistive film material serving as a material of the resistive film R1 is formed on the entire surface by sputtering (step S4). Then, a photoresist is applied so as to cover the entire surface, and photolithography is performed to shape the photoresist into a resist pattern (first resist pattern) having a shape corresponding to the resistive film R1 (thin-film resistive pattern) (step S5). Then, ion milling is performed to remove a part of the resistive film material that is not covered by the photoresist, that is, the resist film material is etched with the resist pattern formed in step S5 used as a mask to form the resistive film R1 (thin-film resistive pattern) (step S6). After formation of the resistive film R1, the photoresist is peeled (removed) (step S7).

Next, the insulating film H1 is formed (steps S8 to S10). Specifically, a photoresist is applied, and photolithography is performed to leave a photoresist only at portions (portions corresponding to through holes) where the insulating film H1 is not formed (step S8). The thus formed resist pattern (second resist pattern) covers only the end portion of each thin-film resistive pattern. Then, sputtering is performed to form an insulating film material (alumina, silicon nitride, or the like) that covers the resist pattern formed in step S8 (step S9), and the photoresist is peeled to remove the resist pattern and insulating film material formed on an upper surface of the resist pattern (step S10). As a result, the insulating film H1 having the though holes at the positions illustrated in FIG. 10 is formed. The process of the step S10 corresponds to so-called "lift-off". Thus, the photoresist to be formed in step S8 is preferably a bilayer resist so as to reliably remove the photoresist and insulating film material in step S10.

Then, reverse sputtering is performed to etch the entire surface (step S11). A main purpose of the reverse sputtering is to enhance roughness of upper surfaces of the resistive film R1 and insulating film H1. By performing the reverse sputtering, it is possible to enhance adhesion between the resistive film R1 and insulating film H1 which have been formed in the above steps and the conductive film M1 to be formed in the following process.

Next, the conductive film M1 (wiring pattern) is formed (steps S12 to S15). Specifically, a seed electrode film (e.g., laminated film of chrome and copper or laminated film of titanium and copper) is formed on the entire surface (step S12). Then, a photoresist is applied on the entire surface so as to cover the seed electrode film, and photolithography is performed to leave the photoresist only at portions where the conductive film M1 (wiring pattern) is not formed (step S13). As a result, a resist pattern (third resist pattern) that covers the seed electrode film is formed, and plating is applied using a conductive material (e.g., copper) (step S14). A plated conductor thus formed exists only between the resist patterns and does not exist on an upper portion of each resist pattern. After application of the plating, the photoresist is peeled to remove the resist pattern (step S14). As a result, the conductive film M1 (wiring pattern) having a planar shape illustrated in FIG. 10 is formed. After formation of the conductive film M1, etching is performed to remove exposed seed electrode film (part of the electrode film that is not covered by the conductive material) (step S15).

Next, the protective film I1 is formed (step S16). Specifically, a photosensitive polyimide is applied on the entire surface, and photolithography is performed to form the contact holes CH at formation areas of the terminals T11 to T13 and T21 to T23 to thereby form the protective film of polyimide.

Finally, the terminals T11 to T13 and T21 to T23 are formed (step S17 to S21). Specifically, the conductive film M2 is formed using the same method as that used to form the conductive film M1 (step S17 to S20). Then, plating is applied to form a Ni/Au film to thereby form the plated film M3 on the surface of the conductive film M2 (step S21). As a result, the terminals T11 to T13 and T21 to T23 are formed, and the whole process is ended.

As described above, the coupler 1C illustrated in FIGS. 10 to 13 can be manufactured by the manufacturing method. Further, the resistive film R1 is covered by the insulating film H1 at a time point before formation of the conductive film M1, thereby making it possible to prevent the resistive film R1 from being oxidized during the manufacturing process. As a result, a location-dependent variation in a resistance value of the resistive film R1 in the substrate surface can be reduced.

Note that the coupler 1B according to the second embodiment can also be manufactured by the above manufacturing process. That is, the difference between the coupler 1C and coupler 1B lies only in whether or not the insulating film H1 covers a large part of the lower surface of the conductive film M1, so that by making a size of the area where the photoresist is left larger in step S8, the above manufacturing process can be utilized for manufacturing of the coupler 1B.

Further, in step S11 of the above manufacturing process, the reverse sputtering is performed for the purpose of enhancing roughness of the upper surfaces of the resistive film R1 and insulating film H1. Further, the reverse sputtering may be performed to such a degree that the film thickness of the resistive film R1 at each end portion thereof is gradually reduced from a part thereof contacting an inner wall of the corresponding through hole to an edge surface thereof. Detailed descriptions will be made below.

Figure 16A:
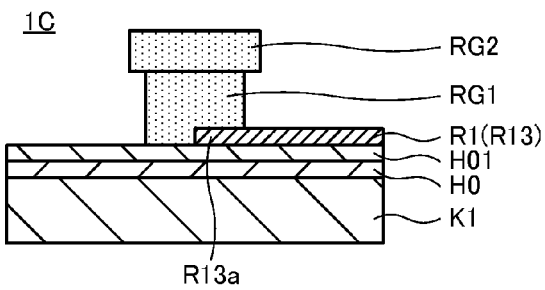
FIGS. 16A to 16E are views each illustrating a state of an area around the one end portion R23a of the thin-film resistive pattern R23 in the manufacturing processes of steps S8 to S15 shown in FIGS. 14 and 15.
Figure 16B:
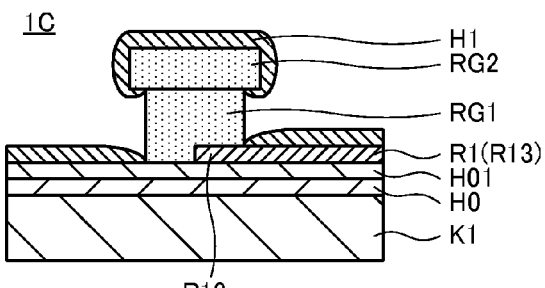
Figure 16C:
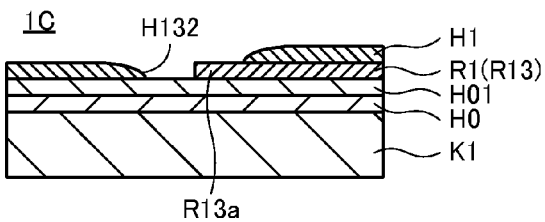
Figure 16D:
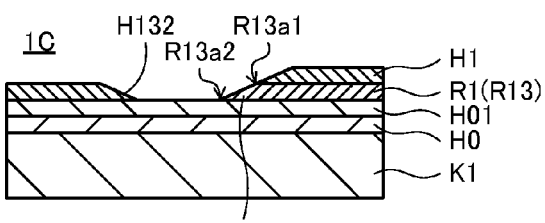
Figure 16E:
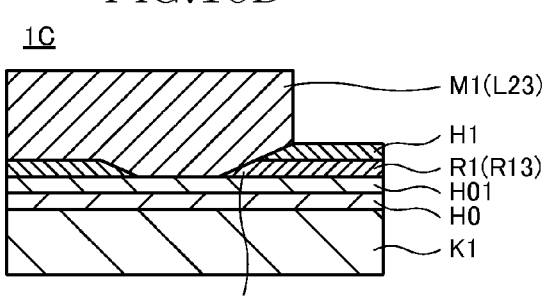

FIGS. 16A to 16E are views each illustrating a state of an area around the one end portion R13a of the thin-film resistive pattern R13 in the manufacturing processes of steps S8 to S15. FIGS. 16A, 16B, 16C, 16D, and 16E correspond to step S8, step S9, step S10, step S11, and steps S12 to S15, respectively. In FIG. 16E, illustration of the seed electrode film is omitted.

As illustrated in FIG. 16A, the photoresist formed in step S8 is a bilayer resist including photoresist RG1 and a photoresist RG2. When the bilayer resist is used, the upper side photoresist RG2 is larger in area than the lower side photoresist RG1, so that the photoresist left at a position corresponding to the through hole in step S8 is shaped into a mushroom pattern as illustrated in FIG. 16A. When the insulating film material to serve as the insulating film H1 is formed in this state (step S9), a film thickness of a part of the insulating film material that is formed on the resistive film R1 is gradually reduced toward the photoresist RG1, as illustrated in FIG. 16B. This is because the path of the atom incoming from a sputtering target is blocked by the photoresist RG2.

Then, when the photoresists RG1 and RG2 are peeled in step S9 (step S10), a through hole H132 is formed as illustrated in FIG. 16C. As illustrated, an inner wall of the through hole H132 has a funnel shape gradually expanding upward. The one end portion R13a of the thin-film resistive pattern R13 is exposed through a bottom surface of the through hole H132.

In this state, the reverse sputtering is performed over a longer period of time than that for enhancement of the roughness of the upper surfaces of the resistive film R1 and insulating film H1 (step S11). Then, as illustrated in FIG. 16D, the film thickness of the thin-film resistive pattern R13 at the one end portion R13a is gradually reduced from a part (position R13a1 in FIG. 16C) thereof contacting the inner wall of the through hole H132 to edge surface (position R13a2 in FIG. 16C) thereof. In short, the one end portion R13a is formed into a tapered shape. This effect is produced by the funnel shaped inner wall of the though hole H132. Thereafter, as illustrated in FIG. 16E, the conductive film M1 is formed (steps S12 to S15).

As described above, in the above manufacturing method, the inner wall of the through hole H132 is formed into the funnel shape, so that when the reverse sputtering is performed over a longer period of time than that for enhancement of the roughness of the upper surfaces of the resistive film R1 and insulating film H1, the end portion of the resistive film R1 can be formed into the tapered shape. This makes it possible to further reduce the contact resistance between the conductive film M1 and resistive film R1.

Figure 17:
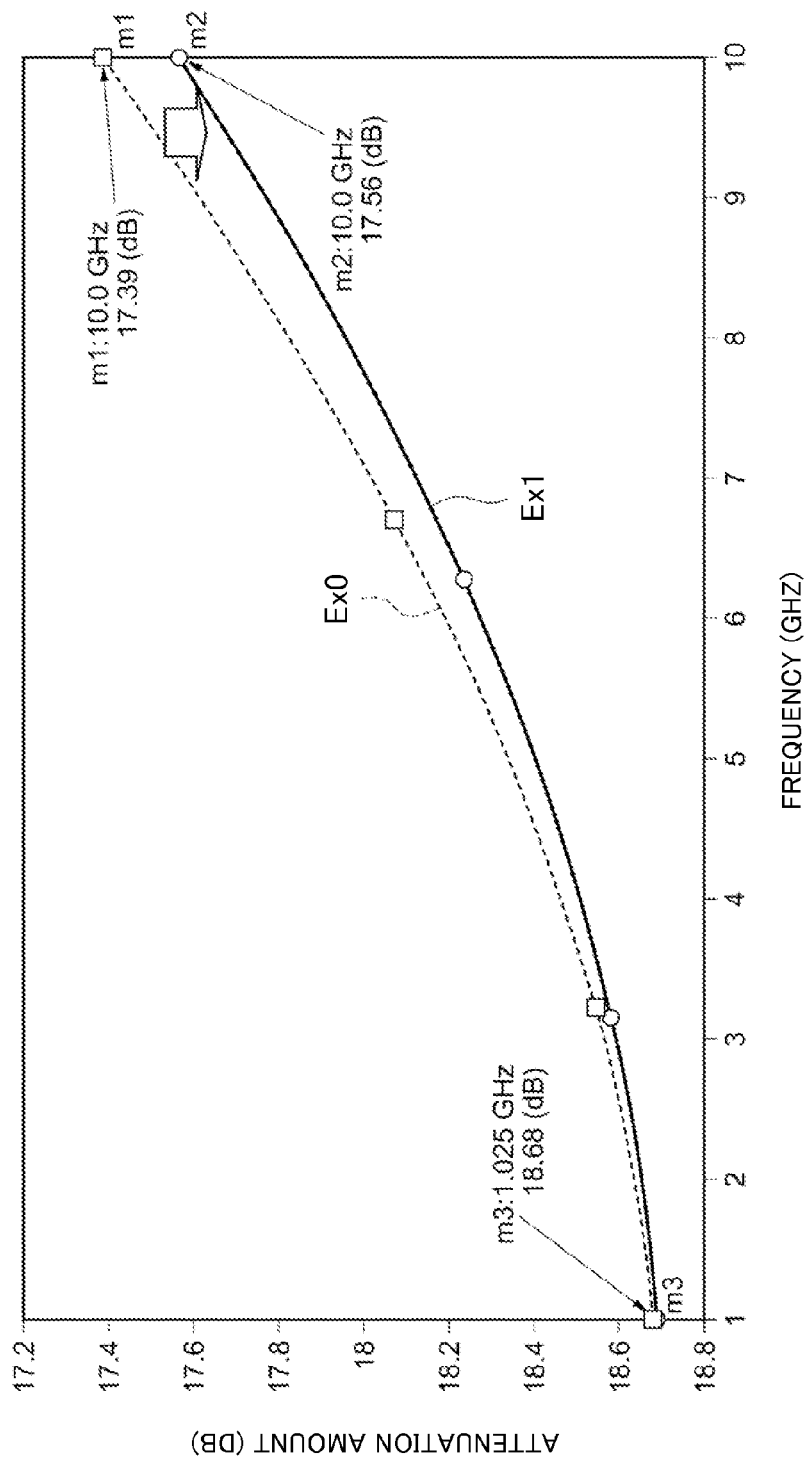
FIG. 17 is a view illustrating a frequency-dependent change in the attenuation amount of a current signal passing through a π-type attenuator having the same circuit configuration as that of the π-type attenuator constituted by the thin-film resistive patterns R11 to R13 illustrated in FIG. 1, about each of cases in one of which the π-type attenuator is realized by the structure of the coupler 1C shown in FIG. 10 (an example Ex1) and in the other of which the π-type attenuator is realized by the structure of the coupler 100 shown in FIG. 18 (a comparative example Ex0)

FIG. 17 is a view illustrating a frequency-dependent change in the attenuation amount of a current signal passing through a π-type attenuator having the same circuit configuration as that of the π-type attenuator constituted by the thin-film resistive patterns R11 to R13 illustrated in FIG. 1. In FIG. 17, an example Ex1 illustrates the frequency-dependent change in the attenuation amount in a case where the π-type attenuator is realized by the structure of the coupler 1C according to the present embodiment, and a comparative example Ex0 illustrates the frequency-dependent change in the attenuation amount in a case where the π-type attenuator is realized by the structure of the coupler 100 according to the above background art. A vertical axis represents a frequency (GHz), and a vertical axis represents an attenuation amount (dB).

Specific materials and producing methods of the π-type attenuators of the example Ex1 and comparative example Ex0 are as follows. As for the example Ex1, a ferrite substrate was used as the substrate K1, and as the planarizing film H0, an alumina was film-formed by sputtering. A surface of the planarizing film H0 was planarized by CMP. As the resistive film R1, a nickel-chrome of 50 Ω/sq was film-formed by sputtering. Patterning of the resistive film R1 was performed by forming a resist pattern by photolithography and removing a part of the resistive film R1 that is not covered by the resist pattern by ion milling. Thereafter, with a resist pattern formed using photolithography, an alumina film was formed as the insulating layer H11, and through holes were formed by lift-off. As the conductive film M1, copper was film-formed by plating. The protective film I1 was formed by patterning a photosensitive polyimide by photolithography. As the conductive film M2, copper was film-formed by plating, and a Ni/Au alloy was formed on a surface of the copper film by plating.

As for the comparative example Ex0, a ferrite substrate was used as the substrate K1, and as the planarizing film H0, an alumina was film-formed by sputtering. A surface of the planarizing film H0 was planarized by CMP. As the resistive film R1, a nickel-chrome of 50 Ω/sq was film-formed by sputtering. As the conductive film M1, copper was film-formed by plating. The protective film I1 was formed by patterning a photosensitive polyimide by photolithography. As the terminal M2, copper was film-formed by plating, and a Ni/Au alloy was formed on a surface of the copper film by plating.

As illustrated in FIG. 17, at a frequency of 1.025 GHz, the attenuation amount was 18.68 dB (point m3 of FIG. 17) in both the example Ex1 and comparative example Ex0. At a frequency of 10.0 GHz, the attenuation amount was 17.39 dB (point m1 of FIG. 17) in the comparative example Ex0, while in the example EX1, the attenuation amount was 17.56 dB (point m2 of FIG. 17). That is, a difference between the attenuation amount obtained at 1.025 GHz and that at 10.0 GHz was 1.29 dB in the comparative example Ex0, while in the example EX1, the difference was 1.12 dB. Thus, it can be understood that the frequency-dependent difference in the attenuation amount is reduced in the example Ex1 as compared to the comparative example.

Although preferred embodiments of the present invention have thus been described, the present invention is by no means limited to the embodiments described above, and various modifications may be made without departing from the spirit of the present invention. For example, the coupler of the present invention may be applied to other electronic components other than the coupler, such as a thin-film capacitor and a filter. Further, various modifications may be made to the coupler without departing from the spirit of the present invention.

For example, in the coupler 1B of the second embodiment and coupler 1C of the third embodiment, the insulating film H1, insulating film H01, and substrate K1 may be formed using the same material. This makes it possible to enhance adhesion among them.

Complementary descriptions of the present invention will be made below.

In Patent Document 3, as for the problem of the present invention, a resistive film formed when a resistor element is formed is left remaining on the entire surface area just below a conductor constituting the main line and sub line (a part of the conductor that does not function as a resistor element). As a result, since current easily flows on a conductor surface in a high-frequency region due to the skin effect, a loss occurs due to the resistive film in the structure in which the resistive film is left remaining on the entire surface just below the conductor constituting the main line and sub line of the coupler. Further, recently, a frequency band to be used in a mobile communication device and a wireless LAN device is becoming higher and higher, so that it is a problem that a variation in the attenuation amount in the function of the attenuator is increased as the frequency to be used becomes high.

Further, in a resistor-equipped coupler having the above structure, a variation in a resistance value in a produced substrate surface is large, which poses a problem that a difference occurs in high-frequency characteristics of the attenuator.

Therefore, one of the objects of the present invention is to provide a coupler in which a variation in the high-frequency characteristics of an attenuator using a resistor element is reduced.

The coupler 1 illustrated in FIG. 1 includes the first line L1, the second line L2 electromagnetically coupled to the first line, resistors R11, R12, and R13 constituting a π-type attenuator provided on the coupling terminal T21 side, and resistors R21, R22, and R23 constitute a π-type attenuator provided on the isolation terminal T22 side. As the electromagnetic coupling between the first line L1 and second line L2, the magnetic coupling M and capacitive couplings C1 and C2 are illustrated in FIG. 1.

In the coupler 1, one end of the first line L1 is connected to the input terminal T11, and the other end thereof is connected to the output terminal T12. Further, one end of the second line L2 is connected to the coupling terminal T21 through the resistor R11, and the other end thereof is connected to the isolation terminal T22 through the resistor R21. One ends of the resistors R12, R13, R22, and R23 are connected to the ground terminal T23.

Length of the first and second lines L1 and L2 are determined depending on specification of the coupler 1. For example, the length may be set such that the coupler 1 serves as a quarter-wavelength (λ/4) resonator circuit for a target transmission signal.

With reference to FIG. 1, basic operation of the coupler 1 will be described. A signal is input to the input terminal T11 and output from the output terminal T12. When the signal is input to the input terminal T11, a main current IM flows in the first line L1. When the main current flows in the first line L1, induced current IL based on the magnetic coupling M flows in the second line L2 in one direction, and displacement current IC based on the capacitive couplings C1 and C2 flows in the second line L2 in two opposite directions. The resulting current flowing in the second line L2 is the sum of the induced current IL based on the magnetic coupling M and the displacement current IC based on the capacitive couplings C1 and C2, and as a result, current having directivity corresponding to a flowing direction of the induced current flows toward the coupling terminal T21. As described above, when a signal is input to the input terminal T11 of the coupler and output from the output terminal T12, a signal corresponding to a part of the above signal is output from the coupling terminal T21.

The coupler 1 is used, for example, for an output monitor of a power amplifier (PA). In such a case, the input terminal T11 of the coupler 1 is connected to an output terminal of the power amplifier, and the coupling terminal T21 of the coupler 1 is connected to an input terminal of the power amplifier through an AGC detection circuit. With this configuration, when a signal output from the power amplifier is input to the input terminal T11 of the coupler 1, a signal corresponding to a part of the signal output from the power amplifier is output from the coupling terminal T21 of the coupler 1 and is input as a feedback signal to the power amplifier through the AGC detection circuit. As a result, an output gain of the power amplifier is controlled to be maintained constant.

Further, the coupler 1 can be used, for example, for control of an antenna tuner of a wireless communication device. In such a case, the input terminal T11 of the coupler 1 is connected to an output terminal of the antenna, and the coupling terminal T21 of the coupler 1 is connected to an antenna switch. With this configuration, when a signal output from the antenna is input to the input terminal T11, a signal corresponding to a part of the signal is output from the antenna and is input as an output feedback signal of the antenna to the antenna switch. As a result, an output gain of the antenna is controlled to be maintained constant. For broadband use, presence of the resistors R11, R12, R13, R21, R22, and R23 as attenuators contributes to maintenance of stability against impedance fluctuation.

The following describes the coupler 1A (FIGS. 2 to 6) which is the first embodiment of the above coupler 1. As illustrated in FIG. 2, in the coupler 1A, the main line L11 is connected to the terminals T11 and T12 and disposed opposite to the sub line L21 in the same plane to be electromagnetically coupled to the sub line L21. The sub line L21 is connected to the coupling terminal T21, isolation terminal T22, and ground terminal T23 through the thin-film resistive patterns R11, R12, R13, R21, R22, and R23.

As illustrated in FIG. 3, the planarizing film H0 and insulating film H01 are formed on the substrate K1. The insulating film H01 need not be provided when sufficient insulation can be ensured without it. The thin-film resistive patterns R13 and R23 are formed on the insulating film H01. The insulating film H1 is formed so as to cover only a part of each of the thin-film resistive patterns R13 and R23 other than the connection portion thereof to the conductive film M1 (wiring layer) and the conductive film M1 is formed on a part of each of the thin-film resistive patterns R13 and R23 that is not covered by the insulating film H1. The protective film I1 is formed on the conductive film M1 and insulating film H1. The terminals T21, T22, and T23 are formed by a laminated body of the conductive film M1 and terminal M2. The plated film M3 is formed on surfaces of the terminals T21, T22, and T23.

As illustrated in FIG. 4, the width W1 of the thin-film resistive pattern R13 is smaller than the width W2 of the conducting film M2, and the thin-film resistive pattern R13 is covered by the conductive film M1 at its left- and right-side end portions and upper surface portions having lengths of X1 and X2, respectively. Only the upper surface of the thin-film resistive pattern R13 excluding the above connection portion is covered by the insulating film H1.

For example, as the substrate K1, an alumina substrate, a glass substrate, a ferrite substrate, an aluminum nitride substrate, or the like can be used. The planarizing film H0 can be formed by sputtering of alumina, followed by planarization using CMP. The use of a spin-on glass (SOG) method allows the planarizing film H0 to be planarized without use of CMP. It is preferable to select, as the insulating film H01, a silicon nitride film or an alumina film. The thin-film resistive pattern R13 is preferably formed of tantalum nitride, a nickel chrome alloy, or the like. The conductive film M1 and terminal M2 can each be formed of, Cu, Ag, Pd, Ag—Pd, Ni, Au, or the like and obtained by using sputtering, an evaporation method, a printing method, photolithography or the like. As the plated film M3, Ni/Au plating or Ni/Sn plating can be used. The protective film I1 can be formed of an inorganic insulator such as silicon nitride, aluminum oxide, or silicon dioxide, or an organic insulator such as polyimide or epoxy resin.

The coupler 1B (FIGS. 7 to 9) according to the second embodiment of the coupler 1 differs from the coupler 1A illustrated in FIG. 2 and the like in that the insulating film H1 is formed so as to cover the upper surface and side surfaces of each of the thin-film resistive patterns R11 to R13 and R21 to R23 excluding the connection portion between each of the thin-film resistive patterns R11 to R13 and R21 to R23 and conductive film M1.

As is clear from a comparison between FIGS. 6 and 9, the insulating film H1 covers only the upper surfaces of the thin-film resistive patterns R22 and R23 in the coupler 1A, while the coupler 1B has a structure in which the insulating film H1 covers not only the upper surfaces of the thin-film resistive patterns R22 and R23 but also the side surfaces thereof.

The coupler 1C (FIGS. 10 to 13) according to the third embodiment of the coupler 1 differs from the coupler 1B illustrated in FIG. 7 and the like in that connection start and end points of the respective thin-film resistive patterns R11 to R13 and R21 to R23 are connected to the conductive film M1 through the through holes H111, H112, H121, H122, H131, H132, H211, H212, H221, H222, H231, and H232 each of which is formed using the insulating film H1, respectively and that each of the through holes H111, H112, H121, H122, H131, H132, H211, H212, H221, H222, H231, and H232 has an opening width larger than the width W3 of each of the thin-film resistive patterns R11 to R13 and R21 to R23.

Unlike the insulating film H1 of the coupler 1B, the insulating film H1 of the coupler 1C is formed under the conductive film M1, as well as on the upper surfaces of the thin-film resistive patterns R13 and R23 to form the through holes H131, H132, H231, and H232 at areas corresponding to the connection portions between the thin-film resistive patterns R13, R23 and conductive film M1.

As illustrated in FIG. 12, the width of the thin-film resistive pattern R13 is W3, and the through holes H131 and H132 formed using the insulating film H1 at the connection portion between the thin-film resistive pattern R13 and conductive film M1 each have an opening width larger than the width W3 of the thin-film resistive pattern R13.

In the couplers 1B and 1C, the insulating film H01 and insulating film H1 may be formed using the same material as that used for forming the substrate surface. Hereinafter, the coupler 1B and coupler 1C thus formed are referred to as a fourth embodiment.

The embodiments (first to fourth embodiments) of the present invention have the following effects.

In the coupler 100 (FIGS. 18 to 21) according to the background art of the present invention, the thin-film resistive pattern R1 exists on and contacts the entire lower surface of the conductive film M1, so that, in a high-frequency region, current flowing in the conductive film M1 intensively flows in the thin-film resistive pattern R1 formed under the conductive film M1 due to a skin effect, causing high-frequency loss. On the other hand, in the coupler 1A according to the first embodiment of the present invention, as illustrated in FIGS. 2 to 6, each of the thin-film resistive patterns R11 to R13 and R21 to R23 and conductive film M1 are fully separated from each other by the insulating film H1 at a portion other than the connection portion between each of thin-film resistive patterns R11 to R13 and R21 to R23 and conductive film M1 to be electrically isolated from each other, whereby the above high frequency loss can be prevented. Further, in addition to the effect of preventing degradation of the thin-film resistive pattern, such as oxidation thereof, the insulating film H1 has a heat radiation effect and an ESD resistance enhancing effect. The enhancement of the ESD resistance prevents progress of degradation of the resistive film R1.

The coupler 100 (FIGS. 18 to 21) according to the background art of the present invention has a structure in which the thin-film resistive pattern contacts the entire lower surface of the conductive film M1, while the coupler 1B according to the second embodiment of the present invention has a structure in which the insulating film H1 is formed so as to cover the upper surface and side surfaces of each of the thin-film resistive patterns R11 to R13 and R21 to R23 excluding the connection portion between each of the thin-film resistive patterns and conductive film M1 as shown in FIGS. 7 to 9. Thus, in the coupler 1B, it is possible to easily prevent the resistive films R11 to R13 and R21 to R23 from being oxidized immediately after formation of the insulating film H1 more reliably than in the first embodiment, thereby reducing a variation in a resistance value of the thin-film resistive pattern.

The coupler 100 (FIGS. 18 to 21) according to the background art of the present invention has a structure in which the thin-film resistive pattern contacts the entire lower surface of the conductive film M1, while the coupler 1C according to the third embodiment of the present invention has a structure in which each of the through holes H111, H112, H121, H122, H131, H132, H211, H212, H221, H222, H231, and H232 has an opening width larger than the width W3 of each of the thin-film resistive patterns R11 to R13 and R21 to R23 as shown in FIGS. 10 to 13. Thus, the width W3 (which is one of the factors that determines a resistance value to a great degree) of each of the thin-film resistive patterns R11 to R13 and R21 to R23 can be made to fall within a range between a start point and an end point of each thin-film resistive patterns R11 to R13 and R21 to R23. Thus, a variation in a resistance value among the thin-film resistive patterns R1 to R13 and R21 to R23 can be reduced.

Further, the insulating film H1 is formed using a thin-film insulating film, so that accuracy of patterning over a distance (which is one of the factors that determines a resistance value to a great degree) between the through holes corresponding to the start and end points of each of the thin-film resistive patterns R11 to R13 and R21 to R23 is improved, so that a variation in a resistance value among the thin-film resistive patterns R11 to R13 and R21 to R23 can be reduced as compared to a case where the insulating film H1 is formed using a thick-film insulating film. Further, a DC resistance component in each of the through holes H111, H112, H121, H122, H131, H132, H211, H212, H221, H222, H231, and H232 and occurrence of high-frequency loss due to parasitic inductance can be reduced.

Further, the insulating film H1 is formed under the lower portion of the main line L11 and sub line L12, so that a contact area between the insulating film H1 covering the thin-film resistive patterns R11 to R13 and R21 to R23 and insulating film H01 formed under the thin-film resistive patterns is increased. Thus, adhesion between the insulating film H1 and insulating film H01 is improved as compared to that in the coupler 1B according to the second embodiment, thereby suppressing peeling of the insulating film H1.

The coupler 100 (FIGS. 18 to 21) according to the background art of the present invention has a structure in which the thin-film resistive pattern contacts the entire lower surface of the conductive film M1, while in the couplers 1B and 1C according to the fourth embodiment, the insulating film H01 and insulating film H1 are each formed using the same material as that used for forming the substrate surface. This makes it possible to enhance adhesion among the insulating film H01, insulating film H1, and substrate surface to a level equivalent to that in a case where the thin-film resistive pattern is absent. Further, forming the insulating film H01 and insulating film H1 using an inorganic material, such as an alumina film or a silicon nitride film, having low responsiveness to the thin-film resistive pattern prevents influence due to oxidization of the thin-film resistive pattern to reduce a variation in a resistance value in the substrate surface.

A description of FIG. 17 will be given once again. In the configuration of the coupler 1C illustrated in FIGS. 10 to 13, a ferrite substrate was used as the substrate K1, and as the planarizing film H0, an alumina was film-formed by sputtering, followed by planarization using CMP. As the thin-film resistive pattern, a nickel-chrome of 50 Ω/sq was film-formed by sputtering, followed by patterning of the thin-film resistive pattern which was performed by forming a pattern by photolithography and removing a part of the thin-film resistive pattern that is not covered by the pattern by ion milling. Thereafter, with a pattern formed using photolithography, an alumina film was formed as the insulating layer H1, and through holes were formed by lift-off. Then, the conductor film M1 and thin-film resistive patterns R13 and R23 are connected. As the conductive film M1, a pattern was formed by photolithography, and copper was film-formed by plating. The protective film I1 was formed by patterning a photosensitive polyimide by photolithography. As the terminal M2, a pattern was formed by photolithography, and copper was film-formed by plating, and a Ni/Au alloy was formed on a surface of the copper film by plating.

On the other hand, in the configuration of the coupler 100 illustrated in FIGS. 18 to 21, a ferrite substrate was used as the substrate K1, and as the planarizing film H0, an alumina was film-formed by sputtering, followed by planarization using CMP. As the thin-film resistive pattern R1, a nickel-chrome alloy of 50 Ω/sq was film-formed by sputtering. As the conductive film M1, a pattern was formed by photolithography, and copper was film-formed by plating. The protective film I1 was formed by patterning a photosensitive polyimide by photolithography. As the terminal M2, a pattern was formed by photolithography, and copper was film-formed by plating, and a Ni/Au alloy was formed on a surface of the copper film by plating.

FIG. 17 illustrates the frequency characteristics of the attenuator in the thus obtained couplers 10 and 100. An ideal attenuator does not have the frequency characteristics but exhibits a constant attenuation amount. In the comparative example Ex0, the attenuation amount was as large as 17.39 dB at a frequency of 10 GHz, which is problematic for use. On the other hand, in the example Ex1, the attenuation amount was reduced to 17.56 dB, which is an improvement of about 0.2 dB.

INDUSTRIAL APPLICABILITY

According to the present invention, the frequency characteristics of an attenuator can be improved as compared to a conventional one, and a reduction in size and thickness of the coupler can be achieved. The reduction in size and thickness of the coupler can be achieved while maintaining required characteristics of the coupler, so that the present invention can be widely applied to a wireless communication device, apparatus, module, and system for which compactness is required, facilities provided with them, and a manufacturing process of them.

REFERENCE SIGNS LIST 1, 1A TO 1D COUPLER
CH CONTACT HOLE
H0 PLANARIZING FILM
H01 INSULATING FILM
H1 INSULATING FILM
H111, H112, H121, H122, H131, H132, H211, H212, H221, H222, H231, H232 THROUGH HOLE
I1 PROTECTIVE FILM
K1 SUBSTRATE
L1 FIRST LINE
L11, L21 TO L25 WIRING PATTERN
L2 SECOND LINE
M1, M2 CONDUCTIVE FILM
M3 PLATED FILM
R1 RESISTIVE FILM
R11 TO R13, R21 TO R23 RESISTOR (THIN-FILM RESISTIVE PATTERN)
RG1, RG2 PHOTORESIST
T11 INPUT TERMINAL
T12 OUTPUT TERMINAL
T13, T23 GROUND TERMINAL
T21 COUPLING TERMINAL
T22 ISOLATION TERMINAL

What is claimed is:

1. A coupler comprising:
a substrate;
an input terminal and an output terminal which are provided on the substrate;
a main line provided on the substrate and having one end connected to the input terminal and the other end connected to the output terminal; and
a sub line including a conductive film and a resistive film which are provided on the substrate and electromagnetically coupled to the main line at a part of the conductive film,
the conductive film including first and second wiring patterns,
the resistive film including a first resistive film pattern having:
a first end portion fitted between the first wiring pattern and the substrate; and a second end portion fitted between the second wiring pattern and the substrate, and the first and second end portions each contacting the conductive film at least a upper surface and end surface.

2. The coupler as claimed in the claim 1 further comprising an insulating film formed so as to cover the resistive film, wherein the insulating film comprises first and second through holes in which the respective first and second end portions are exposed, and the resistive film and the conductive film contact each other inside the first and second through holes.

3. The coupler as claimed in the claim 2, wherein a film thickness of the first resistive film pattern is gradually reduced from a part thereof contacting an inner wall of each of the first and second through holes to a corresponding end surface thereof.

4. The coupler as claimed in the claim 2, wherein the first resistive film pattern is a linear pattern extending in a first direction, and a width of the first resistive film in a second direction perpendicular to the first direction is smaller than a width of each of the first and second through holes in the second direction.

5. An electronic component comprising:

a substrate; and a wiring including a conductive film and a resistive film which are provided on the substrate, the conductive film including first and second wiring patterns, the resistive film including, a first resistive film pattern having:

a first end portion fitted between the first wiring pattern and the substrate; and a second end portion fitted between the second wiring pattern and the substrate, and the first and second end portions each contacting the conductive film at least at its upper surface and end surface.

6. An electronic component manufacturing method comprising:

forming a resistive film having a first resistive film pattern including first and second end portions;

after formation of the resistive film, forming an insulating film covering an upper surface of the first resistive film pattern excluding upper surfaces of the first and second end portions and exposing the first and second end portions;

after formation of the insulating film, forming a conductive film having first and second wiring patterns covering the first and second end portions, respectively;

forming a protective film having, at its bottom surface, a contact hole in which the conductive film is exposed; and forming a terminal contacting the conductive film through the contact hole.

7. The electronic component manufacturing method as claimed in the claim 6, wherein the forming of the insulating film includes:

forming a second resist pattern covering the first and second end portions;

forming an insulating film material covering the second resist pattern; and removing the second resist pattern and insulating film material formed on an upper surface of the second resist pattern.

8. The electronic component manufacturing method as claimed in the claim 7 further comprising:

after formation of the insulating film, removing a part of each of the exposed first and second end portions by reverse sputtering.

9. The electronic component manufacturing method as claimed in the claim 6, wherein:

the forming of the resistive film includes:

forming a resistive film material;

forming a first resist pattern covering the resistive film material;

etching the resistive film material with the first resist pattern used as a mask; and removing the first resist pattern.

10. The electronic component manufacturing method as claimed in the claim 6, wherein:

the forming of the conductive film includes:

forming a seed electrode film;

forming third resist patterns each covering the seed electrode film;

forming a conductive film material between the resist patterns by plating;

removing the third resist pattern; and removing a part of the seed electrode film that is not covered by the conductive film material.

\* \* \* \* \*